US010812102B2

(12) United States Patent
Cornelius et al.

(10) Patent No.: US 10,812,102 B2
(45) Date of Patent: Oct. 20, 2020

(54) EFFICIENT DATA ENCODING

(71) Applicant: Apple Inc., Cupertino, CA (US)

(72) Inventors: William P. Cornelius, Saratoga, CA (US); Seungyong Baek, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/459,402

(22) Filed: Jul. 1, 2019

(65) Prior Publication Data
US 2020/0007155 A1 Jan. 2, 2020

Related U.S. Application Data

(60) Provisional application No. 62/692,295, filed on Jun. 29, 2018.

(51) Int. Cl.
H03M 7/46 (2006.01)
H03M 7/30 (2006.01)

(52) U.S. Cl.
CPC ........... *H03M 7/46* (2013.01); *H03M 7/3059* (2013.01); *H03M 7/6005* (2013.01); *H03M 7/6011* (2013.01)

(58) Field of Classification Search
CPC ........ H03M 7/14; H03M 7/46; H03M 7/6005; H03M 7/6011; H03M 7/3059
USPC ...................................... 341/50–90; 375/257
See application file for complete search history.

(56) References Cited

U.S. PATENT DOCUMENTS

| 5,973,626 | A | * | 10/1999 | Berger | .................... | H03M 7/42 |
| | | | | | | 341/106 |
| 6,556,628 | B1 | * | 4/2003 | Poulton | ............... | H04L 25/0266 |
| | | | | | | 375/257 |
| 7,015,837 | B1 | * | 3/2006 | Malvar | .................... | H03M 7/46 |
| | | | | | | 341/50 |
| 7,197,190 | B1 | * | 3/2007 | Andrew | ............... | H04N 19/176 |
| | | | | | | 375/E7.047 |
| 7,620,116 | B2 | | 11/2009 | Bessios et al. | | |
| 10,020,687 | B2 | * | 7/2018 | Lecias, Jr. | ............... | H02J 50/12 |
| 2004/0109510 | A1 | | 6/2004 | Bessios et al. | | |
| 2010/0082732 | A1 | * | 4/2010 | Guenther | ............ | H04L 67/1095 |
| | | | | | | 709/203 |
| 2011/0116574 | A1 | | 5/2011 | Dowling et al. | | |
| 2012/0081242 | A1 | * | 4/2012 | He | .................... | H03M 7/4018 |
| | | | | | | 341/107 |
| 2012/0260106 | A1 | * | 10/2012 | Zaks | .................... | G06F 12/1408 |
| | | | | | | 713/190 |
| 2015/0139339 | A1 | * | 5/2015 | Ra | .................... | H04N 21/2368 |
| | | | | | | 375/240.27 |

(Continued)

FOREIGN PATENT DOCUMENTS

WO 2007005060 A1 2/2006

OTHER PUBLICATIONS

Bessios, et al., "Transition-Limiting Codes for 4-PAM Signaling in High Speed Serial Links," Rambus Inc., Los Altos, CA 94022, IEEE, Globecom 2003, 5 pages.

(Continued)

*Primary Examiner* — Lam T Mai
(74) *Attorney, Agent, or Firm* — Kilpatrick Townsend & Stockton, LLP

(57) ABSTRACT

Circuits, methods, and apparatus for efficiently implementing encoding and decoding between binary and multilevel data.

20 Claims, 36 Drawing Sheets

(56) References Cited

U.S. PATENT DOCUMENTS

| | | | |
|---|---|---|---|
| 2015/0244396 A1* | 8/2015 | Kozintsev | H03M 7/46 341/59 |
| 2016/0050427 A1* | 2/2016 | Berry | H04N 19/463 375/240.25 |
| 2017/0026054 A1* | 1/2017 | Nagata | H03M 7/30 |

OTHER PUBLICATIONS

Liu, Zhenyu, "PAM3 Mapping for 802.3bp," Marvell Semiconductor, IEEE P802.3bp RTPGE Task Force, Beijing, China, Mar. 2014, 12 pages.

\* cited by examiner

| b2 | b3 | b4 | U1 | U2 |
|---|---|---|---|---|
| 0 | 0 | 0 | L | L |
| 0 | 0 | 1 | L | 0 |
| 0 | 1 | 0 | L | H |
| 0 | 1 | 1 | 0 | L |
| 1 | 0 | 0 | 0 | 0 |
| 1 | 0 | 1 | 0 | H |
| 1 | 1 | 0 | H | L |
| 1 | 1 | 1 | H | 0 |
| Unused ninth state | | | H | H |

| BITS | OFFSET0 | OFFSET1 | OFFSET2 | OFFSET3 | OFFSET4 | OFFSET5 | OFFSET6 | OFFSET7 |
|---|---|---|---|---|---|---|---|---|
| 000 | LL | OL | LO | LH | HO | HL | HH | OH |
| 001 | OL | LO | LH | HO | HL | HH | OH | LL |
| 010 | LO | LH | HO | HL | HH | OH | LL | OL |
| 011 | LH | HO | HL | HH | OH | LL | OL | LO |
| 100 | HO | HL | HH | OH | LL | OL | LO | LH |
| 101 | HL | HH | OH | LL | OL | LO | LH | HO |
| 110 | HH | OH | LL | OL | LO | LH | HO | HL |
| 111 | OH | LL | OL | LO | LH | HO | HL | HH |

FIG. 30

| b2 | b3 | b4 | U1 | U2 |
|---|---|---|---|---|
| 0 | 0 | 0 | L | L |
| 0 | 0 | 1 | L | 0 |
| 0 | 1 | 0 | L | H |
| 0 | 1 | 1 | 0 | L |
| Unused ninth state | | | | |
| 1 | 0 | 0 | 0 | 0 |
| 1 | 0 | 1 | 0 | H |
| 1 | 1 | 0 | H | L |
| 1 | 1 | 1 | H | H |

EFFICIENT DATA ENCODING

CROSS-REFERENCES TO RELATED APPLICATIONS

This application is a nonprovisional of, and claims the benefit of, U.S. provisional patent application No. 62/692,295, filed Jun. 29, 2018, which is incorporated by reference.

BACKGROUND

Computers and computing devices, such as laptops, all-in-one computers, smartphones, tablets, and other devices, perform data operations using binary data. Binary data is made up of individual bits, which can have one of two states, a 0 or a low, and a 1 or a high. These states can also be referred to as the ON and OFF states.

These computers and computing devices can communicate with each other over cables that can include a number of conductors. These conductors can convey signals, power supplies, or other voltages between or among the devices. These conductors can include wires, coaxial cables, fiber-optic cables, or other types of conductors.

Binary data can be transmitted and received using these conductors. Other types of data having more than one state—multilevel data—can also be transmitted and received using these conductors. Transmitting multilevel data as compared to binary data can increase data rates and more efficiently utilize available bandwidth. But the change from binary data to multilevel data requires an encoding circuit, while the change back from multilevel data to binary data requires a decoding circuit. These circuits can be complex and difficult to implement. These complex circuits can delay computing device deployment, that is, new product time-to-market. They can also increase power dissipation and other resource utilization.

Thus, what is needed are circuits, methods, and apparatus for efficiently implementing encoding and decoding between binary and multilevel data.

SUMMARY

Accordingly, embodiments of the present invention can provide circuits, methods, and apparatus for efficiently implementing encoding and decoding between binary and multilevel data.

An illustrative embodiment of the present invention can provide a method of encoding data where a first number of bits are received and encoded into a second number of symbols. The received bits can be organized into groups of bits, where one of the groups of bits can be referred to as first branch bits and another group of bits can be referred to as second branch bits. One or more first branch bits can be read, and it can be determined if the first branch bits have a value in a set of one or more possible values for the branch bits. If they do, the remaining bits can be encoded in a series of symbols. For example, groups of bits can be encoded into symbols using a translation table (or other method.) The first branch bits can also be encoded into a symbol, for example if the first branch bits include two or more bits. In these and other embodiments of the present invention, the first branch bits might not need to be encoded, for example where the first branch bits only include one bit. If the first branch bits do not have a value in the set of one or more possible values, then one or more second branch bits can be read. Given the value of the second branch bits, one or more symbols in the second number of symbols can be assigned an address value, where the address value is a value that binary data can't be encoded into using the translation table. The remaining bits can then be encoded into the remaining symbols in the second number of symbols using translation table.

Another illustrative embodiment of the present invention can provide a method of decoding data where the second number of symbols are received and decoded into the first number of bits. The received second number of symbols can be examined to see if one or more symbols have been assigned the address value. If they do, then depending on which symbols have the address value, the remaining symbols in the second number of symbols can be decoded, resulting in the decoded first number of bits. If the received second number of symbols do not include the address value, then the symbols can be decoded and the first number of bits recovered.

In a specific embodiment, eleven bits can be encoded into a series of 7 three-level or ternary symbols. For example, binary bits can be encoded into symbols that can be pulse-amplitude modulated symbols or PAM3 symbols. The first two of these bits can be used as the first branch bits. When the first branch bits have one of three possible values, for example 00, 01, or 10, the first branch bits can be encoded as a first symbol. The three subsequent groups of three bits each can then be encoded into two symbols. The resulting 7 symbols can then be transmitted. If the first branch bits do not have one of three possible values, for example, they have a value of 11, the first branch bits can't be encoded in the first symbol, since the 00, 01, and 10 states already correspond to the three possible symbol states. Instead, the first group of three bits, which can be referred to as the second branch bits, are read. Based on the value of the second branch bits, a first symbol can be assigned a value and one of the three subsequent groups of two symbols can be assigned the address value. The first branch bits do not need to be encoded since their value (11) can be determined by a decoder from the presence of an address value. The remaining bits can be encoded into the remaining symbols.

In these and other embodiments of the present invention, groups of three bits can be encoded into two three-level symbols. Three bits can have one of 8 values (8 different combinations), while two three-level symbols can have 9 possible values. This leaves a ninth state for the two symbols that is unused in the encoding of the three bits. This unused ninth state can then be used as an address value, where the presence and position of the address value can be used in decoding a series of symbols.

For example, in a specific embodiment of the present invention, 7 three-level symbols can be decoded into eleven bits. Again, these symbols can be pulse-amplitude modulated symbols or PAM3 symbols. A group of seven symbols can be received. The symbols can be checked for the presence of an address value. If an address value is found, a value for the two first branch bits can be determined to have a value of 11, consistent with the encoding scheme above. The first symbol can be read and from that, along with the location of the address bits, the second branch bits can be determined. The remaining bits can be determined given the position of the address bits. More specifically, since the first branch bits and the second branch bits are known, the 6 bits in the last two groups of three bits remain to be determined. The address value can be located in a pair of the remaining 6 symbols, leaving two groups of two symbols to be decoded. Each group of two symbols can then be decoded into three bits resulting in the last 6 bits, thereby completing the decoded set of eleven bits. If an address value is not present in the 7 three-level symbols, the first symbol can be decoded into the two first branch bits. The remaining three groups of two bits each can be decoded into three groups of three bits, thereby completing the eleven decoded bits.

Another illustrative embodiment of the present invention can provide a method of encoding data where a first number of bits are received and encoded into a second number of symbols. One or more first branch bits can be read, and it can be determined if the first branch bits have a value in a first set of one or more possible values for the branch bits. If they do, the remaining bits can be encoded in a series of symbols using a translation table (or other method.) The first branch bits can also be encoded into a symbol, for example if the first branch bits include two or more bits. In these and other embodiments of the present invention, the first branch bits might not need to be encoded, for example where the first branch bits only include one bit. If the first branch bits do not have a value in the first set of one or more possible values, then one or more second branch bits can be read. It can then be determined if the second branch bits have a value in a second set of values. If they do, then given the value of the second branch bits, one or more symbols in the second number of symbols can be assigned an address value, where the address value is a value that binary data can't be encoded into using the translation table. If the second branch bits do not have a value in the second set of values, then one or more third branch bits can be read. As before, it can then be determined if the third branch bits have a value in a third set of values. If they do, then given the value of the third branch bits, two or more symbols in the second number of symbols can be assigned an address value. This can be repeated as necessary until the remaining bits can be encoded into the remaining symbols in the second number of symbols.

Another illustrative embodiment of the present invention can provide a method of decoding data where the second number of symbols are received and decoded into the first number of bits. The received second number of symbols can be examined to see if one or more symbols have been assigned the address value. If they have, then depending on which symbols have the address value, the remaining symbols in the second number of symbols can be decoded, resulting in the decoded first number of bits. If the received second number of symbols do not include the address value, then the symbols can be decoded and the first number of bits recovered.

In a specific embodiment, 19 bits can be encoded into a series of 12 three-level symbols. As before, these binary bits can be encoded into symbols that can be pulse-amplitude modulated symbols or PAM3 symbols. The first of these bits can be used as the first branch bit. If the first branch bit has a specific value, for example 0, then the remaining 18 bits can be arranged in 6 groups of three bits each and encoded into a corresponding 6 pairs of two symbols for a total of 12 symbols. If the first branch bit does not have the specific value, for example it is a 1, then a subsequent set of three bits can be used as second branch bits. If the second branch bits have a value in a second set of values, then one pair of symbols can be assigned the address value, where the location of the address value is dependent on the value of the second branch bits. The remaining 5 groups of three bits can be encoded into the remaining 5 pairs of symbols. There is no need to encode the first branch bit or the second branch bits since their value can be determined by a decoder from the presence of an address value. If the second branch bits do not have a value in the second set of values, then a subsequent set of three bits can be used as third branch bits. If the second branch bits have a first specific value, and the third branch bits have a value in a third set of values, then two pairs of symbols can be assigned the address value, where the location of the address values are dependent on the value of the second branch bits and the third branch bits. The remaining 4 groups of three bits can be encoded into the remaining 4 pairs of symbols. Again, there is no need to encode the first branch bit since its value can be determined by a decoder from the presence of an address value. There is also no need to encode the second or third branch bits since their value can be determined by a decoder from the presence of two address values. If the second branch bits do not have the first specific value and the third branch bits have a value in a third set of values, then two pairs of symbols can be assigned the address value, where the location of the address values are dependent on the value of the second branch bits and the third branch bits. The remaining 4 groups of three bits can be encoded into the remaining 4 pairs of symbols. Again, there is no need to encode the first branch bit since its value can be determined by a decoder from the presence of an address value. There is also no need to encode the second or third branch bits since their value can be determined by a decoder from the presence of two address values. If the third branch bits do not have a value in the third set of values, then a subsequent set of three bits can be used as fourth branch bits. Three pairs of symbols can be assigned the address value, where the location of the address values are dependent on the value of the second branch bits, the third branch bits, and the fourth branch bits. The remaining 3 groups of three bits can be encoded into the remaining 3 pairs of symbols. Again, there is no need to encode the first branch bit since its value can be determined by the presence of an address value. There is also no need to encode the second, third, or fourth branch bits since their value can be determined by a decoder from the presence of three address values.

In a specific embodiment, a series of 12 three-level symbols can be decoded into 19 bits. In this example, the 12 symbols can be arranged in 6 pairs. Three of those 6 pairs can have the address value in one of 8 combinations. The 6 symbols pairs are checked to see if they have 3 pairs with address values in one of those 8 combinations. If they do, a first branch bit, second branch bits, third branch bits, and fourth branch bits can be determined. The remaining bits can be decoded from the remaining symbols. If three symbol pair do not have the address value, a check of whether two symbol pairs have the address value is done. The 6 symbol pairs can have two with address values in one of 15 combinations. If they do, a first branch bit, second branch bits, and third branch bits can be determined. The remaining bits can be decoded from the remaining symbols. If two symbol pairs do not have the address value, a check of whether one symbol pair has the address value is done. If it does, a first branch bit and second branch bits can be determined. The remaining bits can be decoded from the remaining symbols. If no symbol pair have the address value, the first branch bit can be set and the symbol pairs can be decoded directly. Again, each of these symbol decoding can be done using a translation table or other appropriate method.

These and other embodiments of the present invention can provide encoders and decoders that can be readily implemented using a minimal amount of logic gates. This can reduce component size, save power, speed design, and improve yields. While examples are shown utilizing specific numbers of bits, symbols, and type of symbols, these and other embodiments of the present invention can utilize different numbers of bits, symbols, and different types of symbol, such as four or five level symbols. Other types of encoding (and decoding), such as phase or frequency encoding, can also be used.

Embodiments of the present invention can provide data encoders and decoders that can be used in various types of devices, such as lighting equipment, portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. Encoded signals can be transmitted using interface circuits and connector receptacles that can provide pathways for signals and power compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future.

Various embodiments of the present invention can incorporate one or more of these and the other features described herein. A better understanding of the nature and advantages of the present invention can be gained by reference to the following detailed description and the accompanying drawings.

BRIEF DESCRIPTION OF THE DRAWINGS

FIGS. 3-5 illustrate a method of encoding data according to an embodiment of the present invention;

FIGS. 30-31 illustrate a method of reducing baseline wander according to an embodiment of the present invention;

FIGS. 32-34 illustrate another method of encoding data according to an embodiment of the present invention.

DESCRIPTION OF ILLUSTRATIVE EMBODIMENTS

Figure 1:
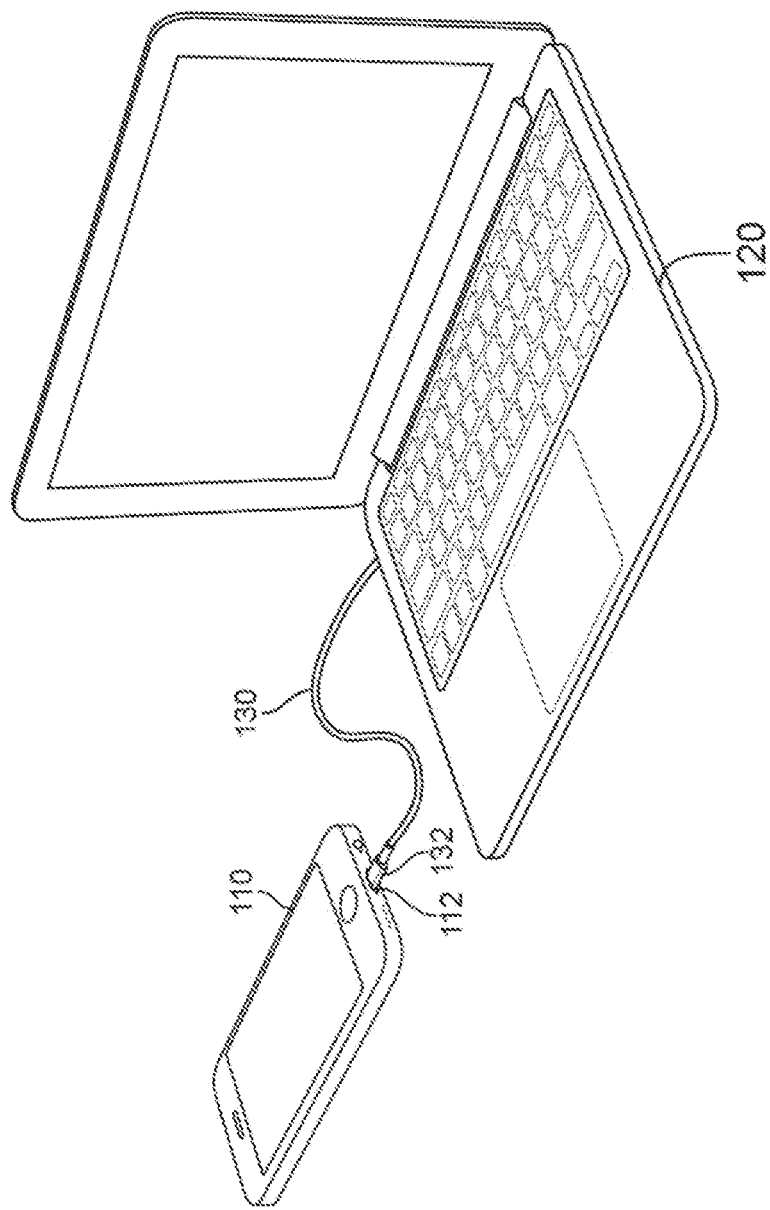
FIG. 1 illustrates an electronic system that can be improved by the incorporation of an embodiment of the present invention.

FIG. 1 illustrates an electronic system that can be improved by the incorporation of an embodiment of the present invention. In this example, a first device 110 can be in communication with a second device 120 over a cable 130. Specifically, connector insert 132 on cable 130 can be inserted into connector receptacle 112 on first device 110, while a second connector insert (not shown) can be inserted into a second connector receptacle (not shown) on second device 120. First device 110 and second device 120 can communicate by sending data to each other over cable 130. One of the two devices can send power to the other over cable 130 as well.

Figure 2:
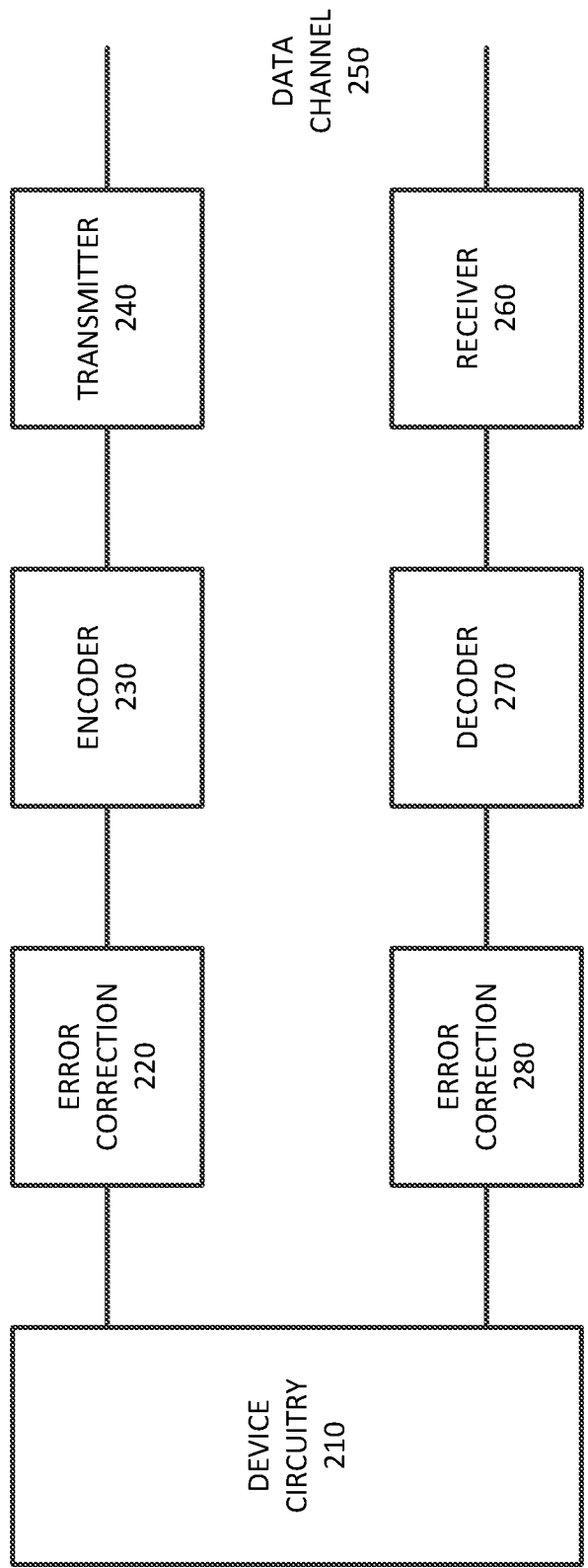
FIG. 2 illustrates an electronic device according to an embodiment of the present invention.

FIG. 2 illustrates an electronic device according to an embodiment of the present invention. This figure, as with the other included figures, is shown for illustrative purposes and does not limit either the possible embodiments of the invention or the claims. Also, in these examples, specific values for binary and multilevel data are shown, and these examples are shown for illustrative purposes and do not limit either the possible embodiments of the invention or the claims. Also, the specific placement of address values and encoded data in these examples are shown for illustrative purposes and do not limit either the possible embodiments of the invention or the claims.

This electronic device can include device circuitry 210. Device circuitry 210 can include one or more integrated circuits, modules, or other circuits or compliments. Device circuitry 210 can implement some or all of the functions of the electronic device. The electronic device can further include transceiver circuitry. This transceiver circuitry can include error correction 220. Error correction 220 can receive data from device circuitry 210 and can implement error correction algorithms and modify data to be transmitted accordingly. This circuitry can also, or instead, include other functions such as interleaving, run length limiting, or other functions. Encoder 230 can receive groups of bits and encode them for transmission by transmitter 240. This encoder 230 can provide an efficient way of encoding data for transmission that reduces power, saves space, reduces design cycle time, and provides other benefits. The encoded data transmitted by transmitter 240 can be a multilevel code, for example, it can be PAM3 data. Transmitter 240 can transmit this data over data channel 250. Data channel 250 can include connectors and cable 130 as shown in FIG. 1 or other connectors and cables consistent with these and other embodiments of the present invention. In these and other embodiments of the present invention, the transmission and reception of data can be wireless.

Symbol data can be received by receiver 260 via data channel 250. Receiver 260 can provide data to decoder 270. This decoder 270 can provide an efficient way of decoding data for transmission that reduces power, saves space, reduces design cycle time, and provides other benefits. Decoder 270 can decode the symbols received from receiver 260 and provide groups of bits to error correction 280. Error correction 280 can implement error correction algorithms and modify the received data accordingly. The circuitry can also or instead include other functions such as de-interleaving, length limiting, or other functions. Error correction 280 can provide data to device circuitry 210.

Figure 3:
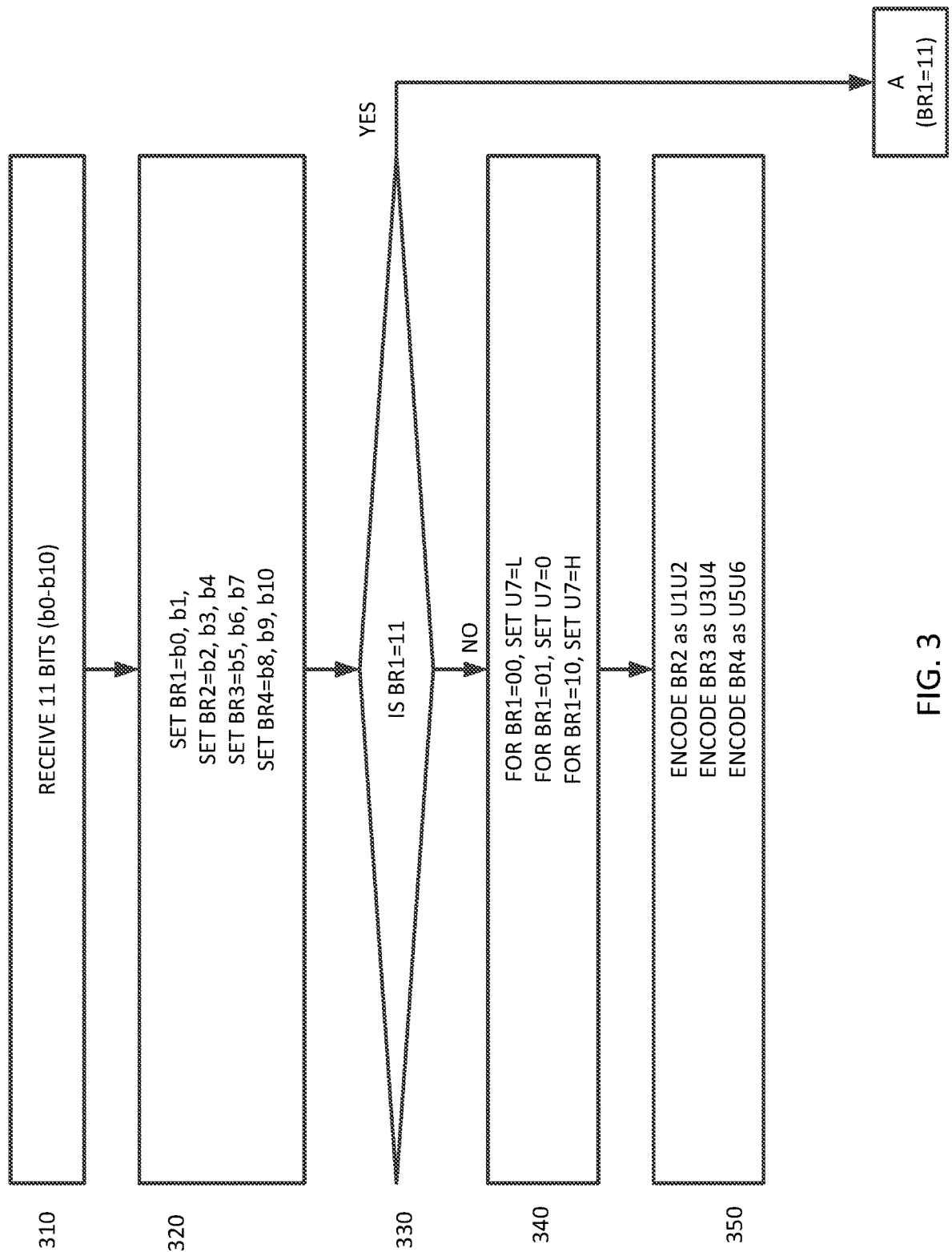
Figure 5:
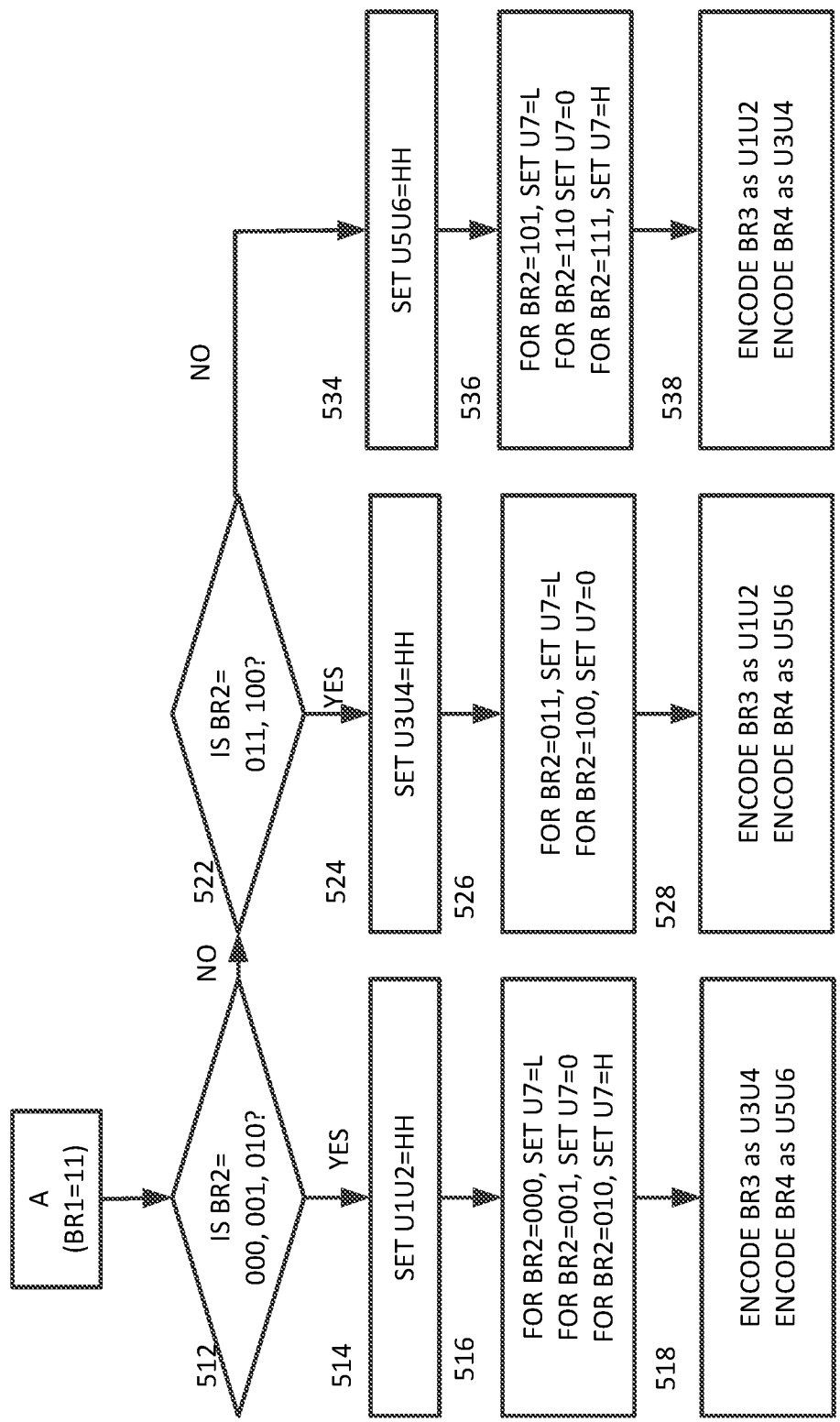

FIGS. 3-5 illustrate a method of encoding data according to an embodiment of the present invention. This illustrative embodiment can provide a method of encoding data where a first number of bits are received and encoded into a second number of symbols for transmission. One or more first branch bits can be read, and it can be determined if the first branch bits have a value in a set of one or more possible values for the branch bits. If they do, the remaining bits can be encoded in a series of symbols using a translation table (or other method.) The first branch bits can also be encoded into a symbol. If the first branch bits do not have a value in the set of one or more possible values, then one or more second branch bits can be read. Given the value of the second branch bits, one or more symbols in the second number of symbols can be assigned an address value, where the address value is a value that binary data can't be encoded into using the translation table. The remaining bits can then be encoded into the remaining symbols in the second number of symbols using the translation table.

In this specific embodiment, eleven bits can be encoded into a series of 7 three-level or ternary symbols. This coding can be selected for its efficiency since eleven bits defines 2048 possibilities, while 7 three-level symbols provides 2187 combinations into which the 2048 possibilities can be mapped. For example, binary bits can be encoded into symbols that can be pulse-amplitude modulated symbols or PAM3 symbols. In FIG. 3, eleven bits can be received in act 310. In act 320, the bits can be arranged in branch bits, where a first branch BR1 is equal to the first two bits, b0 and b1, and where each subsequent branch is equal to the following three bits for four groups of branch bits. If the first branch bits have one of three possible values in act 330, for example 00, 01, or 10, those two bits can be encoded as a first symbol in act 340. The three subsequent groups of three bits each can then be encoded into two symbols in act 350. The resulting 7 symbols can then be transmitted.

In these and other embodiments of the present invention, groups of three bits can be encoded into two three-level symbols. Three bits can have one of 8 values (8 different combinations), while two three-level symbols can have 9 possible values. This leaves a ninth state for the two symbols that is unused in the encoding of the three bits. This unused ninth state can then be used as an address value, where the presence and position of the address value can be used in decoding a series of symbols. In the translation table of FIG. 4, bits b2, b3, and b4 (for example) can be encoded into PAM3 or other three-level symbols U1 and U2, where U1 and U2 can have a low value, a zero value, or a high value. FIG. 4 can also be used to decode symbols U1 and U2 back into bits b2, b3, and b4. This table can be used for encoding various groups of three bits into two symbols, and back again, in the various examples shown below and by other embodiments of the present invention. In these and other embodiments of the present invention, other tables can be used. For example, a table having bits arranged in a gray-code order can be used.

The unused ninth state, in this example a value of HH for U1 and U2, can be used as the address value in the various examples shown below and by other embodiments of the present invention, though in other embodiments of the present invention, other codes, such as LL or 00, can be used as the address value. This address value can be used to efficiently convey values of branch bits thereby simplifying encoding. These address values can also be used in a corresponding decoder to efficiently decode various branch bits, as shown below.

If the first branch bits from FIG. 3 do not have one of three possible values, for example they have a value of 11, the first branch bits can't be encoded in the first symbol. Instead, the first group of three bits b2, b3, and b4, which are referred to as the second branch bits BR2, are read and the encoding procedure continues at block A in FIG. 5. Depending on the value of the second branch bits BR2, the second branch bits BR2 are encoded as the first symbol U7 in acts 516, 526, and 536, and one of the three subsequent groups of two symbols can be assigned the address value (HH) in acts 514, 524, and 534. The first branch bits do not need to be encoded since their value (11) can be determined by a decoder from the presence of an address value. The remaining bits can be encoded into the remaining symbols as shown in acts 518, 528, and 538.

Figure 6:
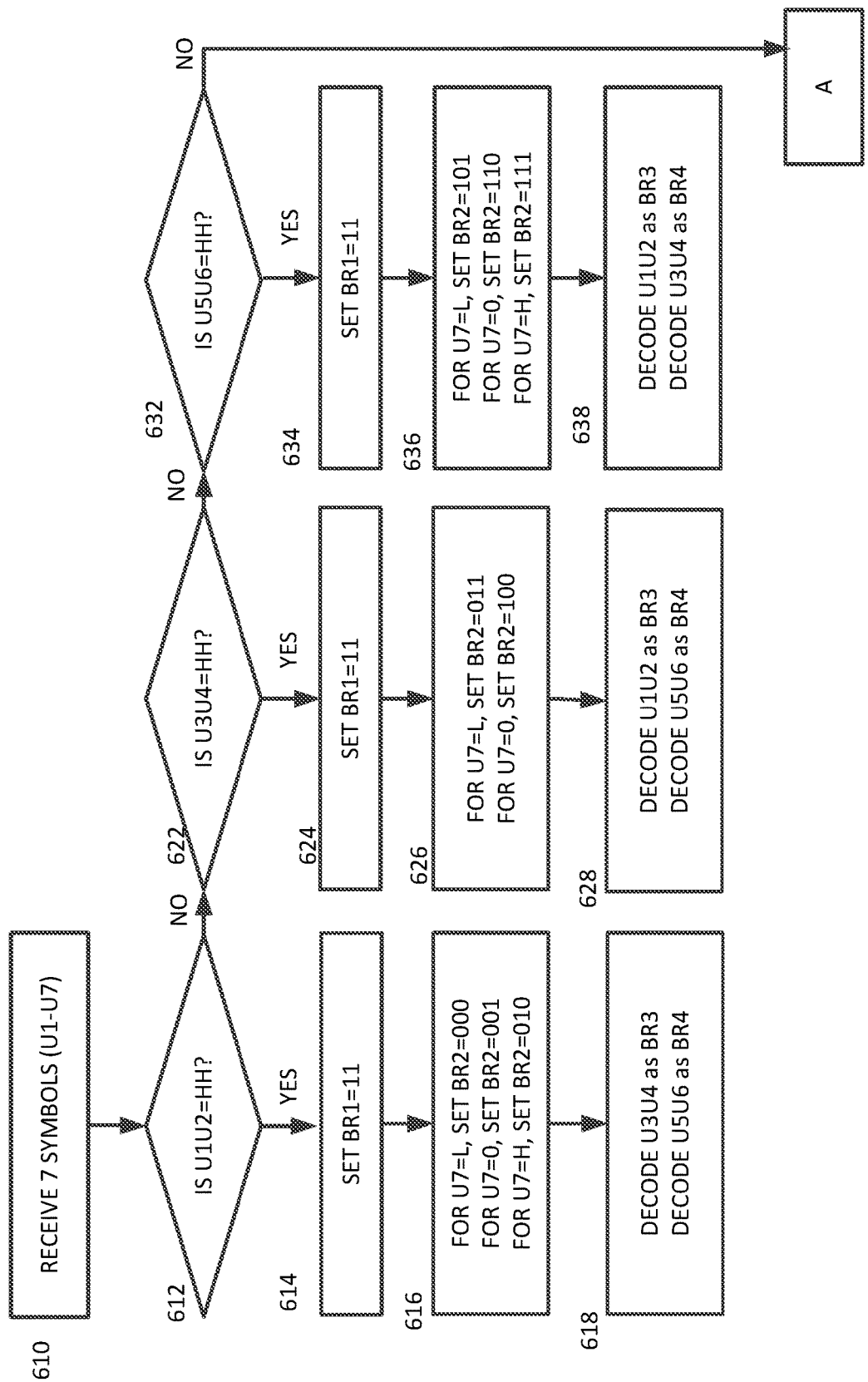
FIGS. 6-7 illustrate a method of decoding data according to an embodiment of the present invention.
Figure 7:
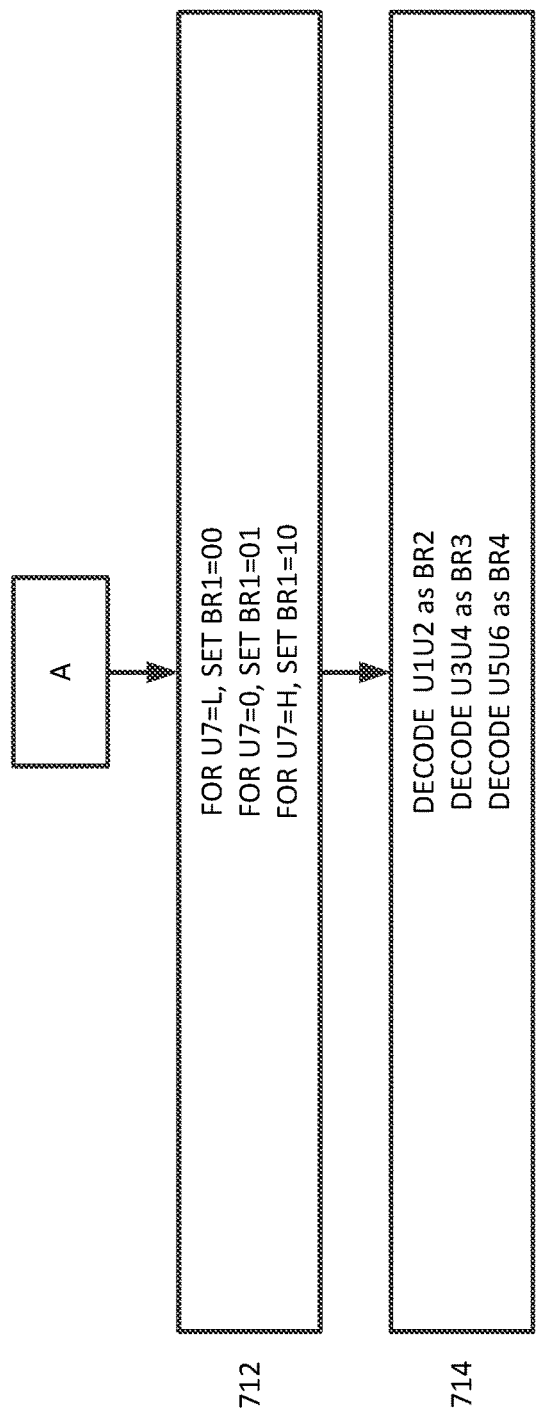

FIGS. 6-7 illustrate a method of decoding data according to an embodiment of the present invention. In this example, the second number of symbols are received and decoded into the first number of bits. The received second number of symbols can be examined to see if one or more symbols have been assigned the address value. If they have, then depending on which symbols have the address value, along with the value of the first symbol, the remaining symbols in the second number of symbols can be decoded, resulting in the decoded first number of bits. If the received second number of symbols do not include the address value, then the symbols can be decoded and the first number of bits recovered.

In this specific embodiment of the present invention, 7 three-level symbols can be decoded into eleven bits. A group of seven symbols U1-U7 can be received in act 610. In this example, U7 can be referred to as a first symbol and U1U2, U3U4, and U5U6 can be referred to as symbol pairs. The symbol pairs can be checked for the presence of an address value in acts 612, 622, and 632. If an address value is found, a value for the two first branch bits BR1 can be determined to have a value of 11 in acts 614, 624, and 634, consistent with the encoding scheme above. The first symbol can be read and from that the second branch bits BR2 can be determined in acts 616, 626, and 636. The remaining bits can be determined given the position of the address bits in acts 618, 628, and 638. More specifically, since the first branch bits and the second branch bits are known, 6 other bits in the last two groups of three bits, remain to be determined. The address value can be located in a pair of the remaining 6 symbols, leaving two groups of two symbols to be decoded. Each group of two symbols can then be decoded into three bits, thereby completing the decoded set of eleven bits.

If an address value is not present in the 7 three-level symbols, the decoding can proceed to block A in FIG. 7. The first symbol can be decoded into the two first branch bits in act 712. The remaining three groups of two bits each can be decoded into three groups of three bits in act 714, thereby completing the eleven decoded bits.

FIGS. 8-16 illustrate another method of encoding data according to an embodiment of the present invention. In this embodiment, a first number of bits are received and encoded into a second number of symbols. A first branch bit can be read, and it can be determined if the first branch bit has a specific value. If it does, the remaining bits can be encoded in a series of symbols using a translation table (or other method.) If the first branch bit does not have a value in the first set of one or more possible values, then one or more second branch bits can be read. It can then be determined if the second branch bits have a value in a second set of values. If they do, then given the value of the second branch bits, one or more symbols in the second number of symbols can be assigned an address value, where the address value is a value that binary data can't be encoded into using the translation table. If the second branch bits do not have a value in the second set of values, then one or more third branch bits can be read. As before, it can then be determined if the third branch bits have a value in a third set of values. If they do, then given the value of the third branch bits, two or more symbols in the second number of symbols can be assigned an address value. This can be repeated as necessary until the remaining bits can be encoded into the remaining symbols in the second number of symbols.

Figure 8:
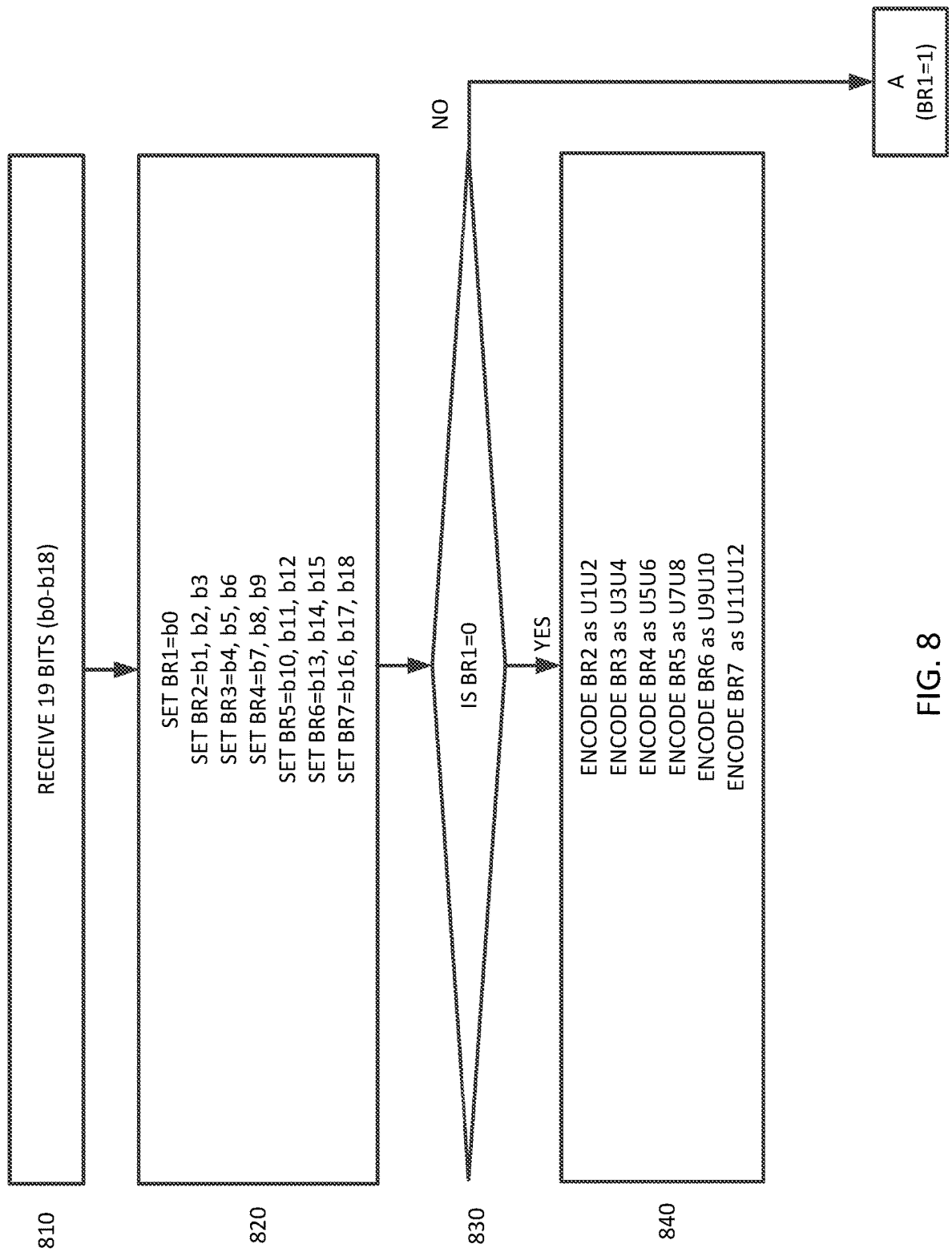
FIGS. 8-16 illustrate another method of encoding data according to an embodiment of the present invention.

In a specific embodiment, 19 bits can be encoded into a series of 12 three-level symbols. This coding can be selected for its efficiency since 19 bits defines 524,288 possibilities, while 7 three-level symbols provides 531,441 combinations into which the 524,288 possibilities can be mapped. As before, these binary bits can be encoded into symbols that can be pulse-amplitude modulated symbols or PAM3 symbols. In FIG. 8, 19 bits can be received in act 810. The first of these bits, b0, can be used as the first branch bit BR1 and subsequent groups of three bits can be referred to as subsequent branch bits in act 820. If the first branch bit BR1 has a specific value, for example 0 in act 830, then the remaining 18 bits can be arranged in 6 groups of three bits each and encoded into a corresponding 6 pairs of two symbols for a total of 12 symbols in act 840. This encoding can be the same or similar to the encoding in FIG. 4 above.

Figure 9:
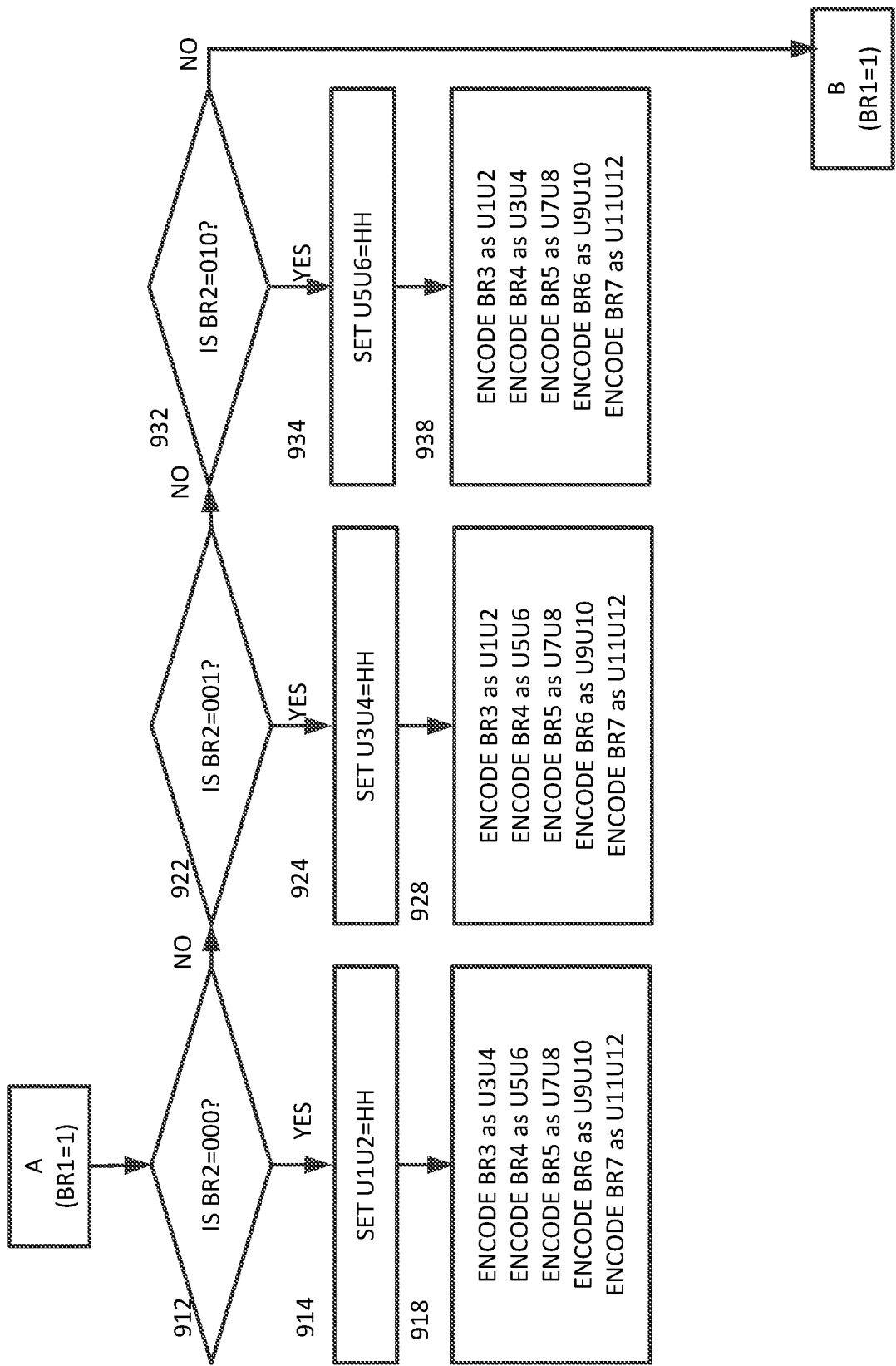
Figure 10:
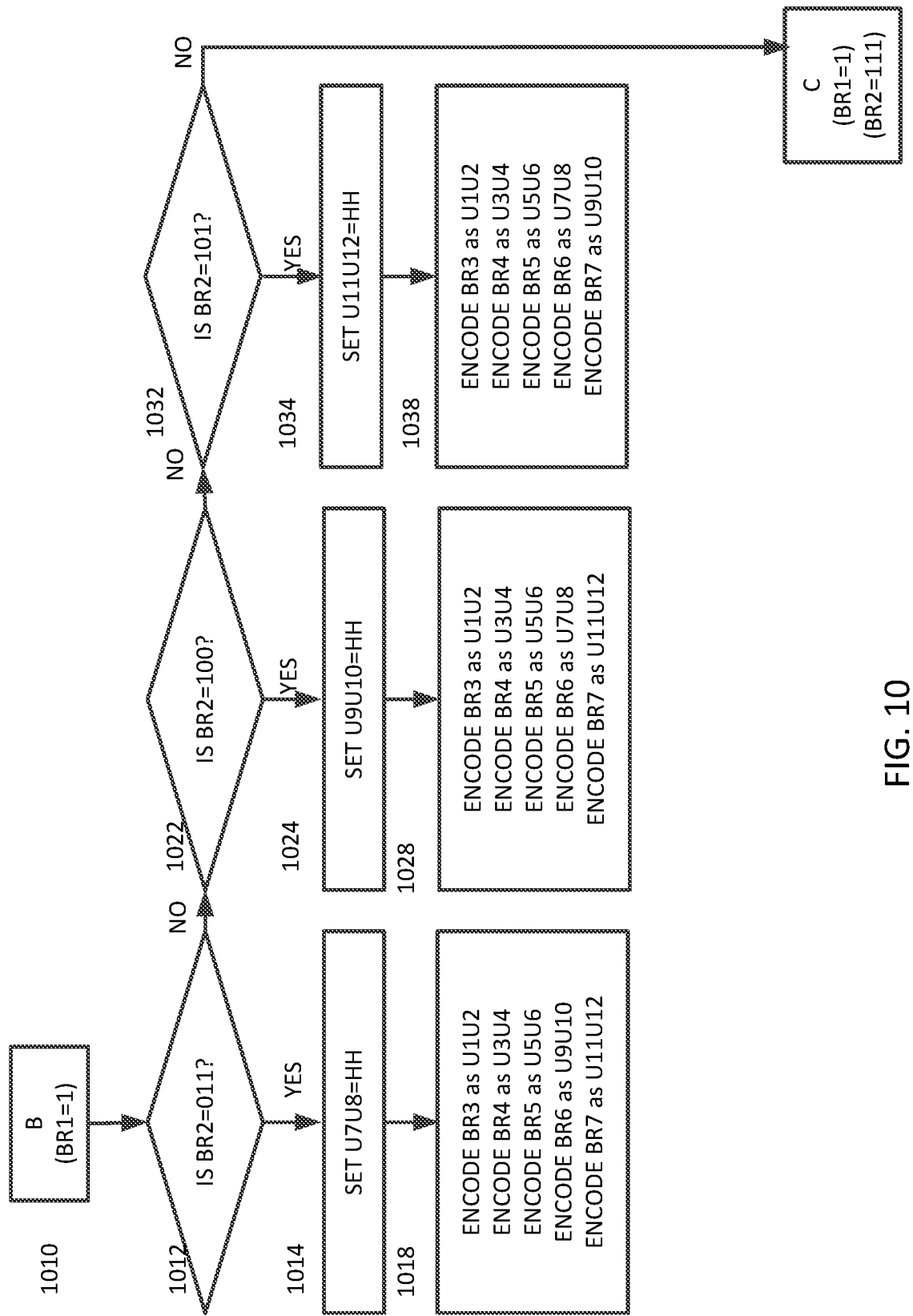

If the first branch bit b0 does not have the specific value, for example it is a 1, then a subsequent set of three bits b1, b2, and b3, can be used as second branch bits and the encoding can continue in FIGS. 9-10. If the second branch bits BR2 have a value in a second set of values in acts 912, 922, 932, 1012, 1022, and 1032, then one pair of symbols can be assigned the address value in acts 914, 924, 934, 1014, 1024, and 1034, where the location of the address value is dependent on the value of the second branch bits. The remaining 5 groups of three bits can be encoded into the remaining 5 pairs of symbols in acts 918, 928, 938, 1018, 1028, and 1038. There is no need to encode the first branch bit or the second branch bits since their value can be determined by a decoder from the presence of an address value.

Figure 11:
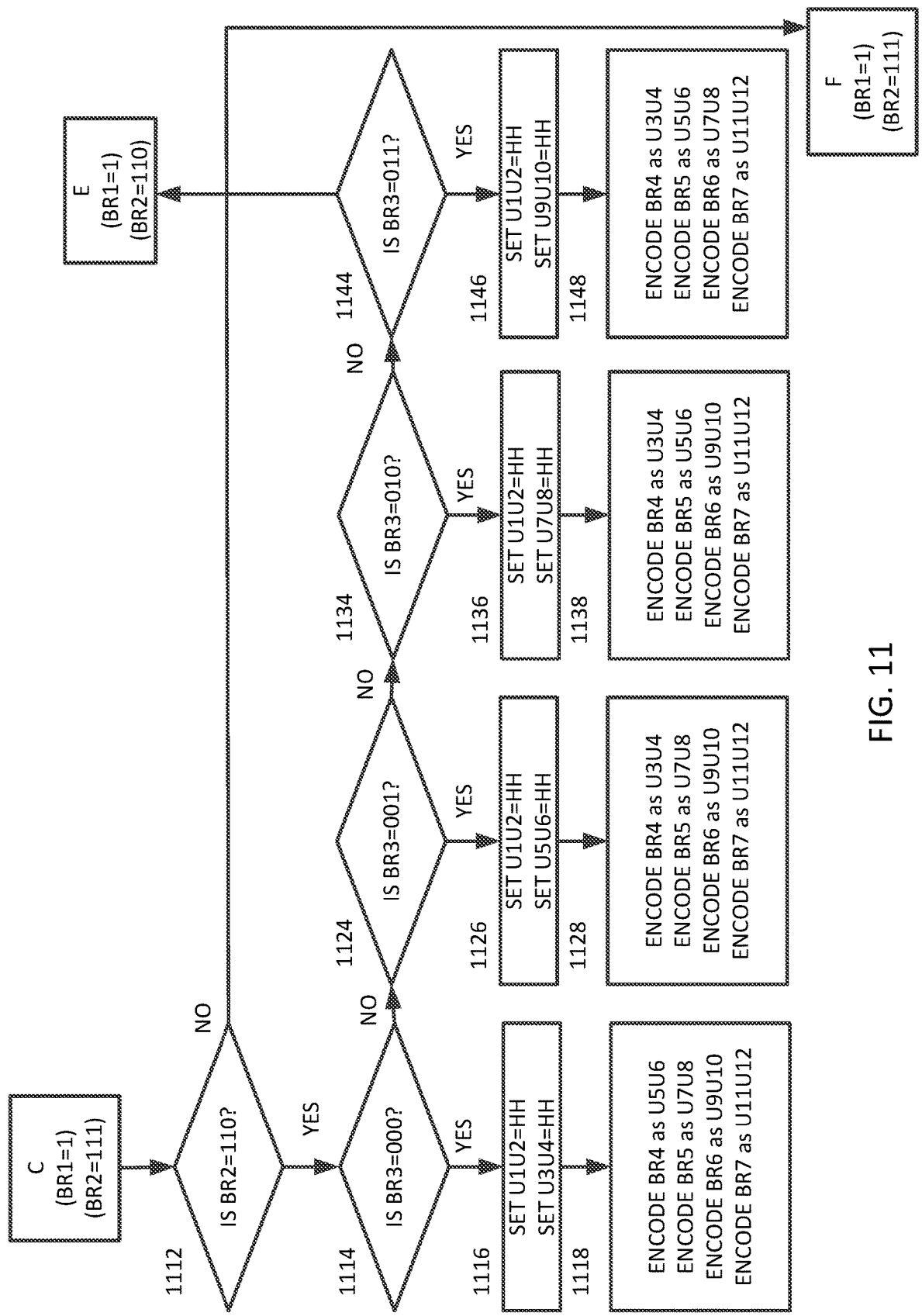
Figure 12:
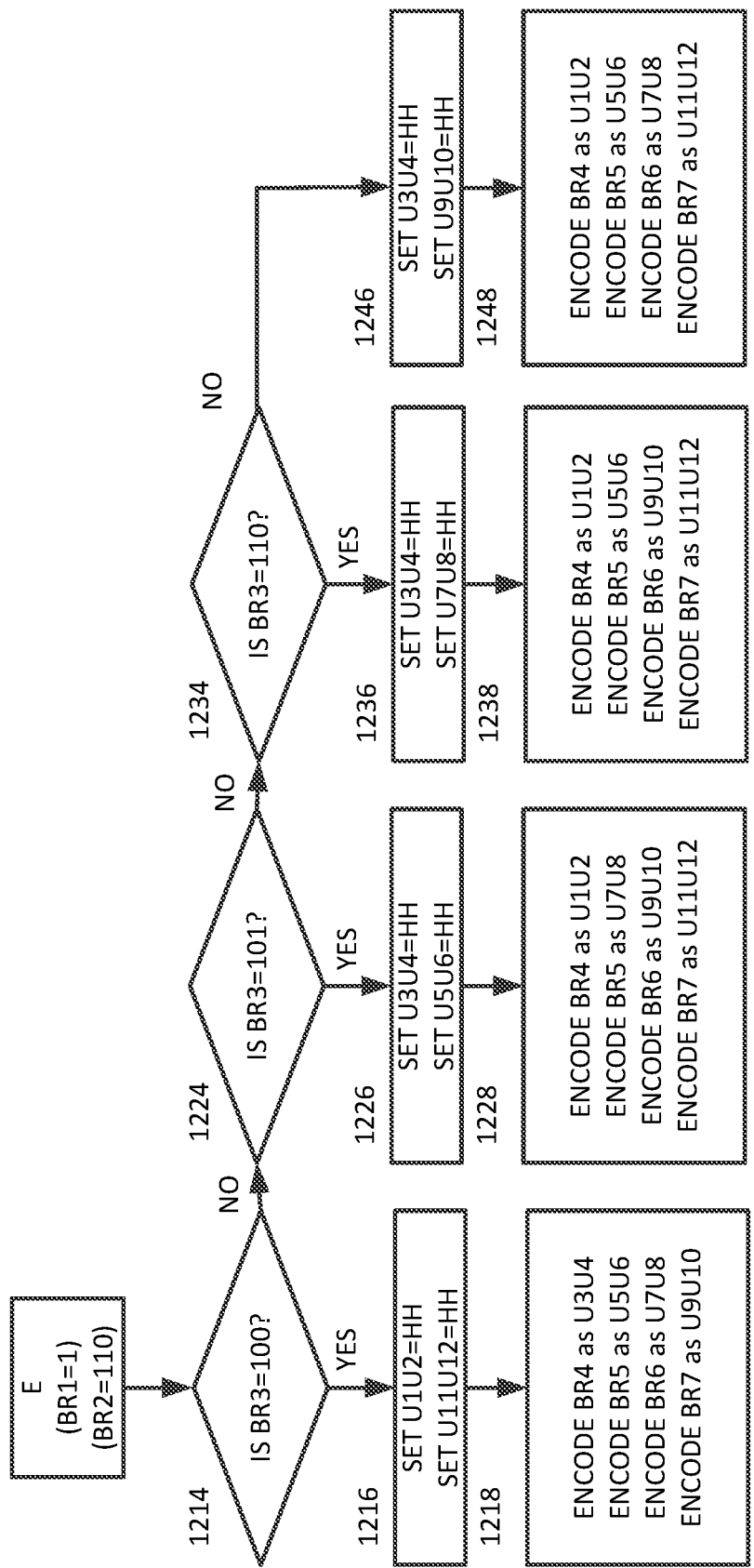

If the second branch bits do not have a value in the second set of values, then a subsequent set of three bits can be used as third branch bits BR3 and the encoding can continue in FIGS. 11-12. If the second branch bits have a first specific value in act 1112, and the third branch bits have a value in a third set of values in acts 1114, 1124, 1124, 1214, 1224, and 1234, then two pairs of symbols can be assigned the address value in acts 1116, 1126, 1136, 1216, 1226, and 1236, where the location of the address values are dependent on the value of the second branch bits and the third branch bits. The remaining 4 groups of three bits can be encoded into the remaining 4 pairs of symbols in acts 1118, 1128, 1138, 1148, 1218, 1228, 1238, and 1248. Again, there is no need to encode the first branch bit since its value can be determined by a decoder from the presence of an address value. There is also no need to encode the second or third branch bits since their value can be determined by a decoder from the presence of two address values.

Figure 13:
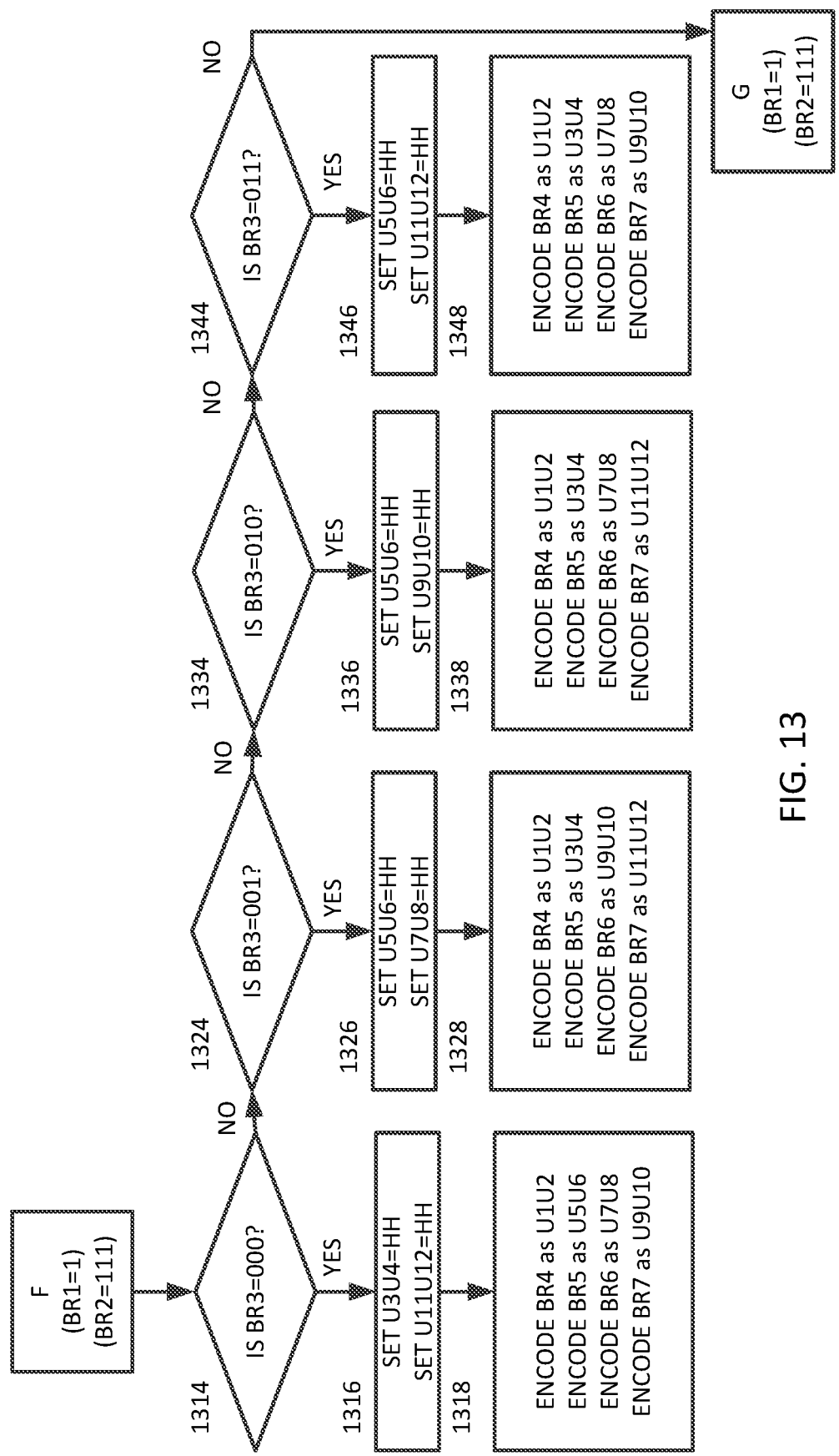
Figure 14:
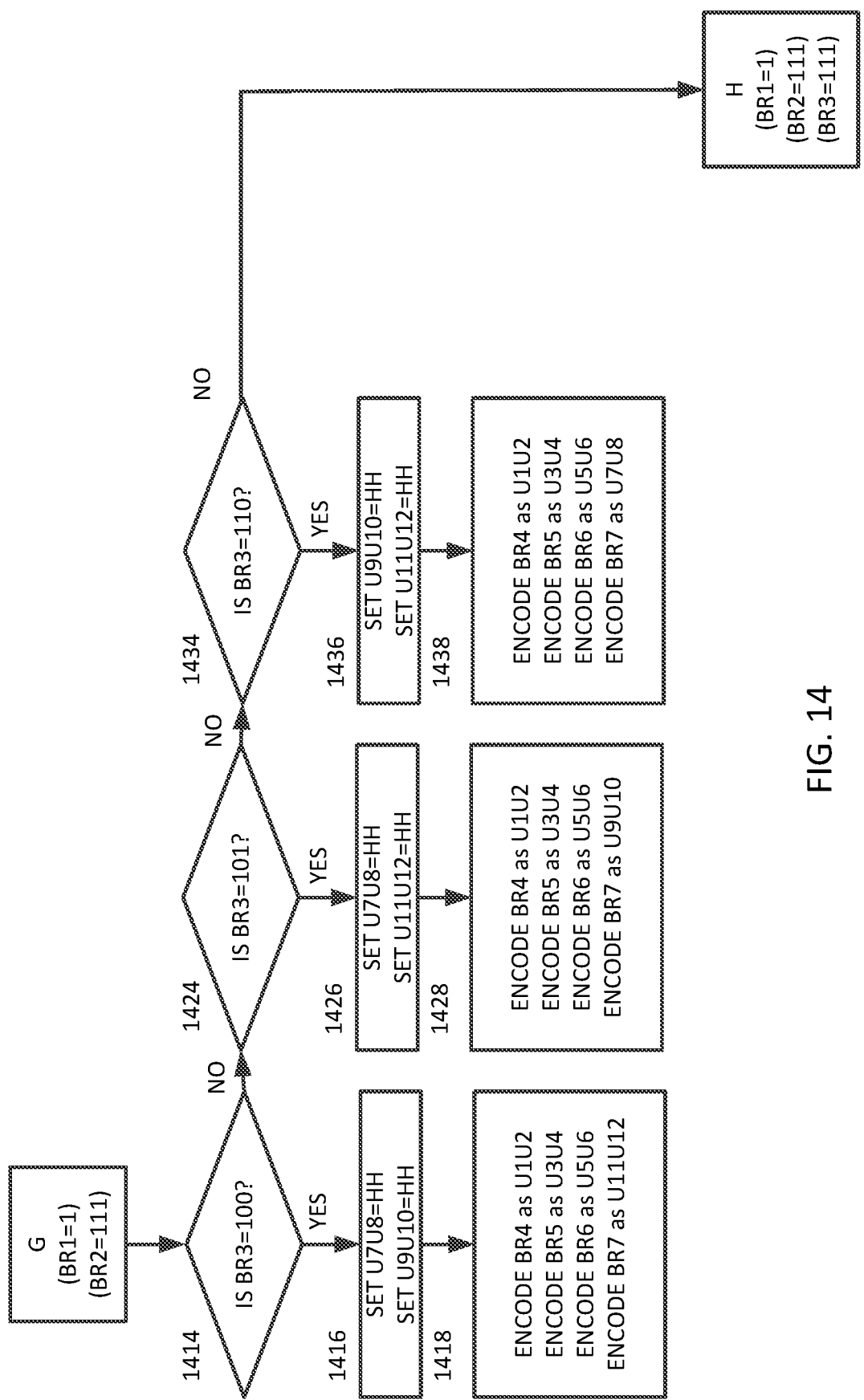
Figure 15:
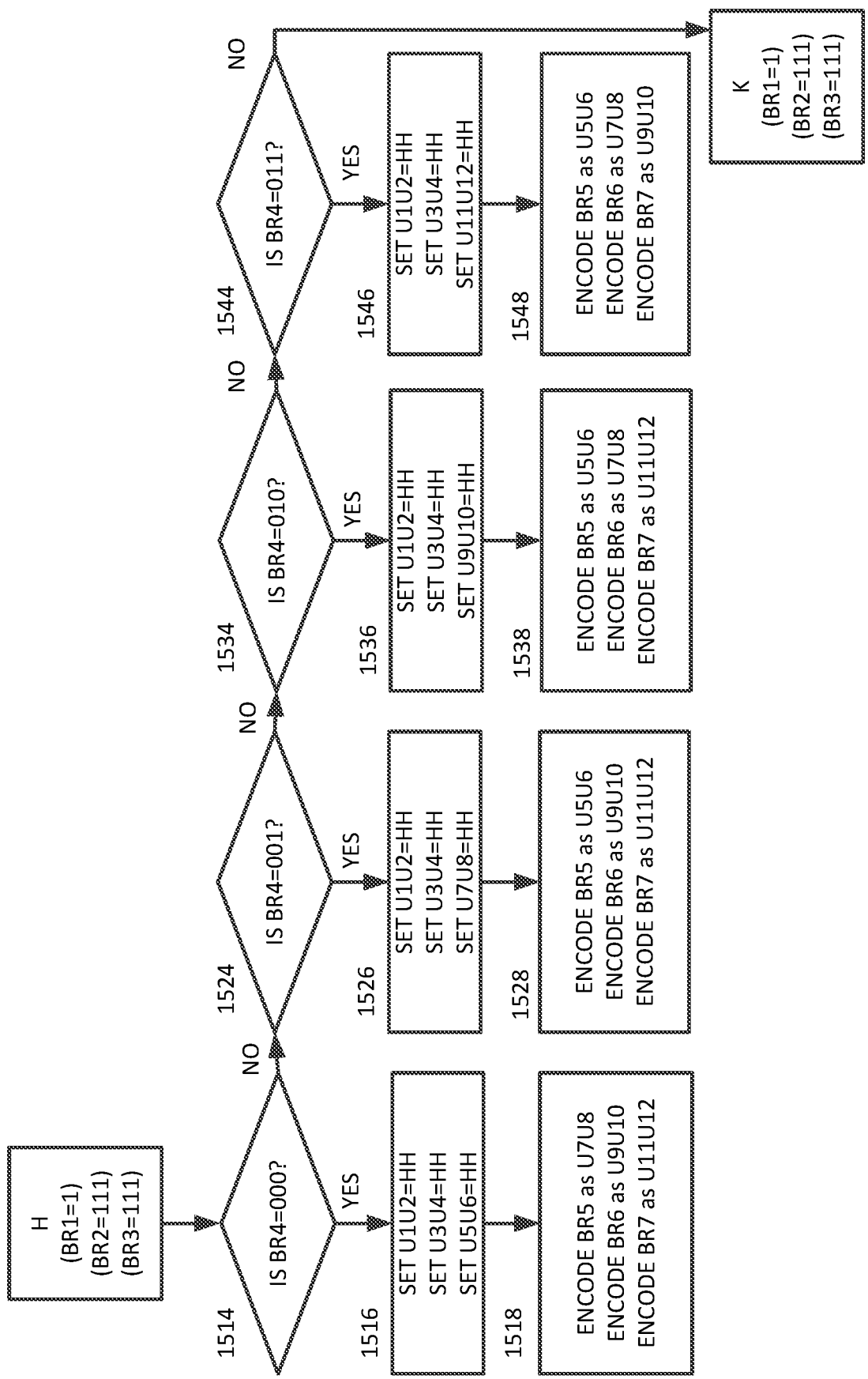
Figure 16:
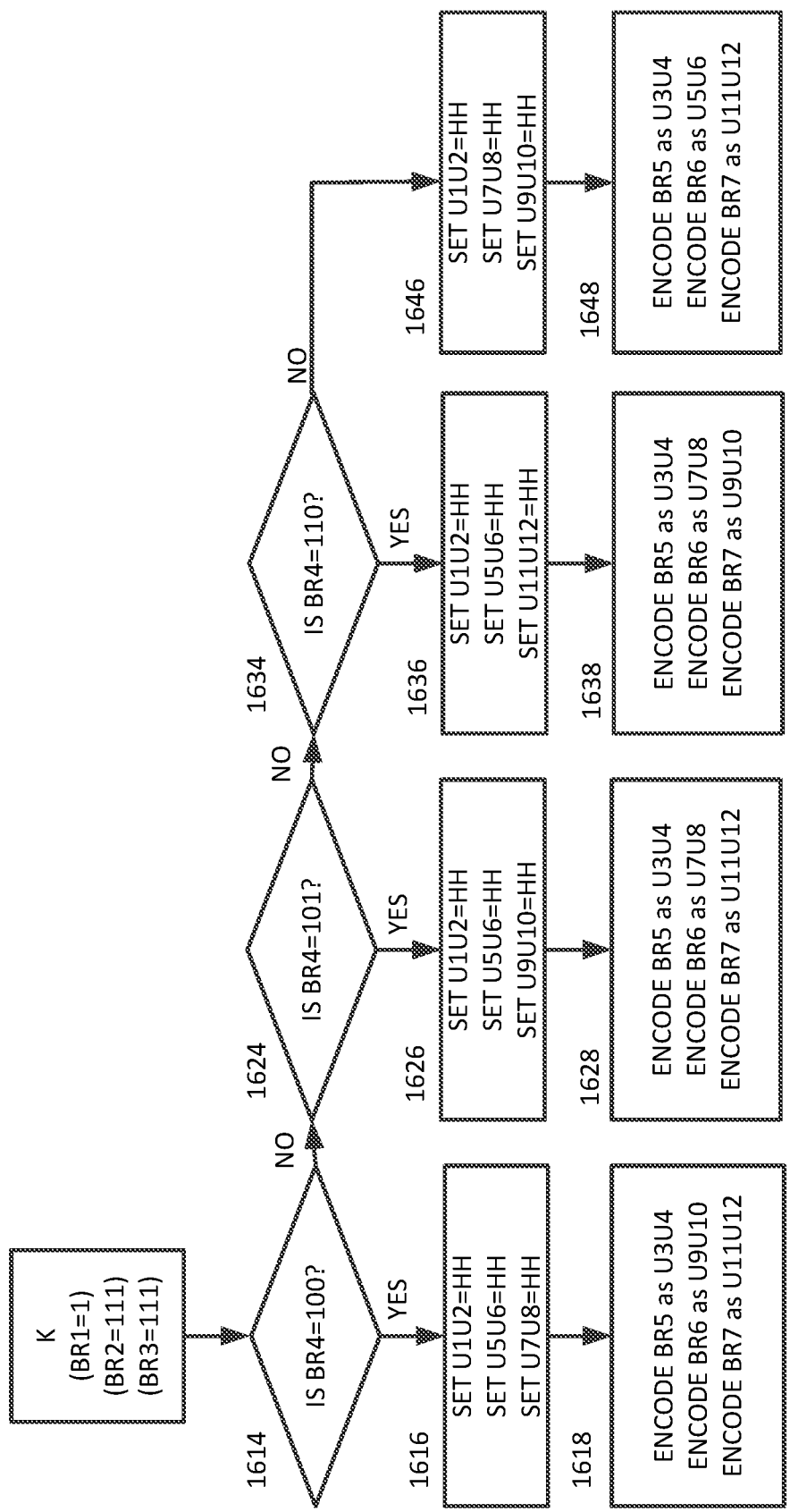
Figure 17:
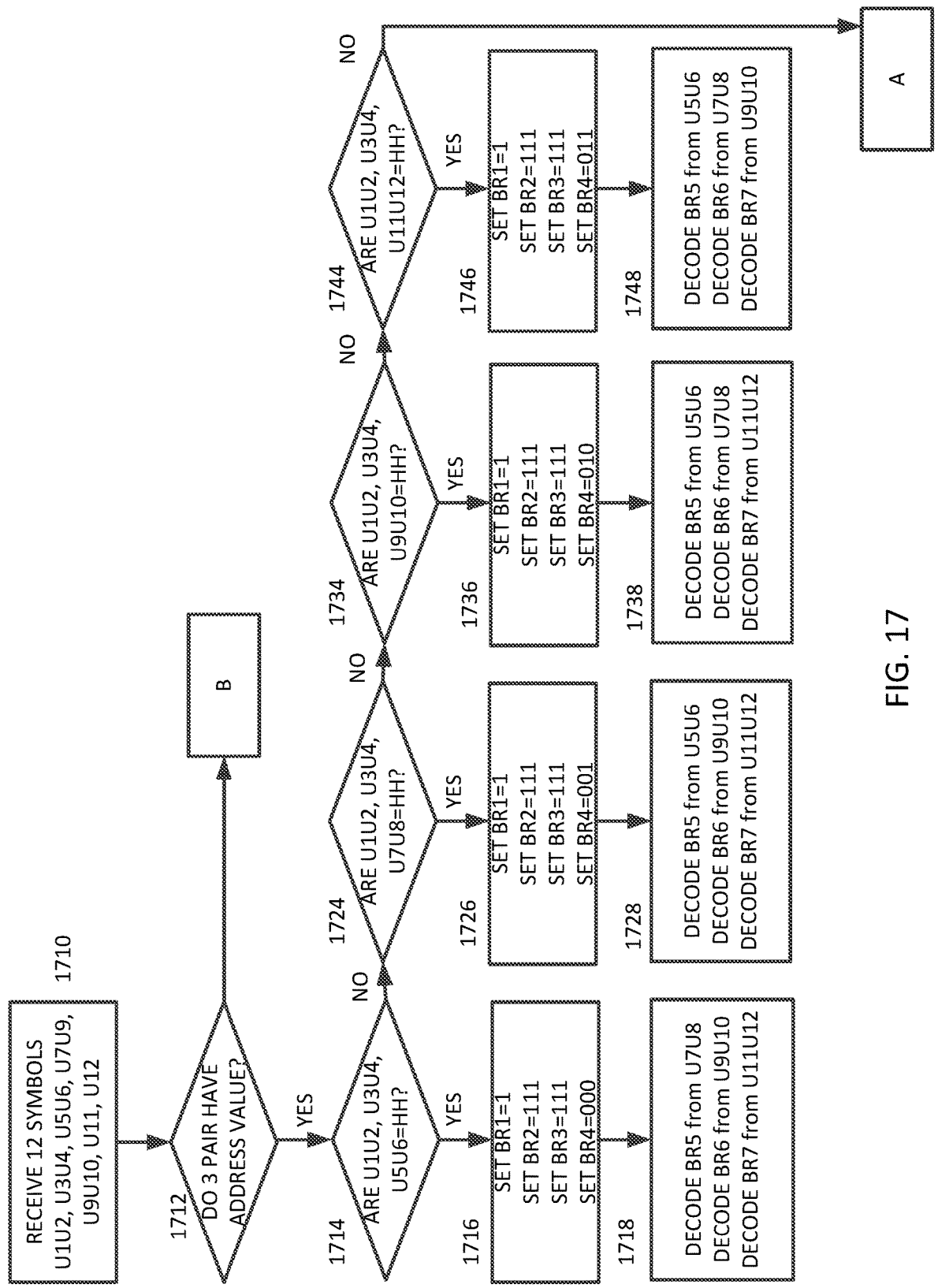
FIGS. 17-25 illustrate another method of decoding data according to an embodiment of the present invention.
Figure 18:
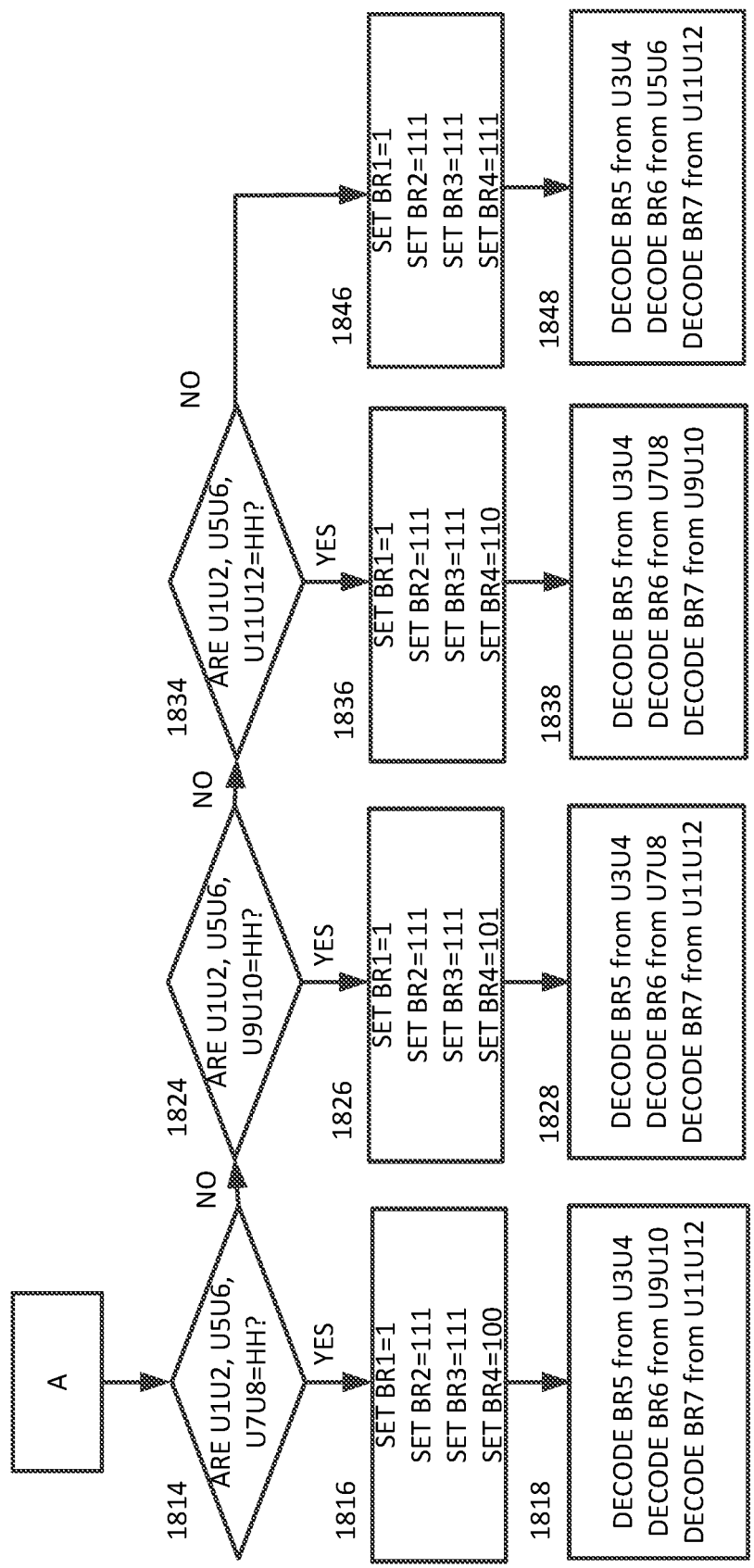
Figure 19:
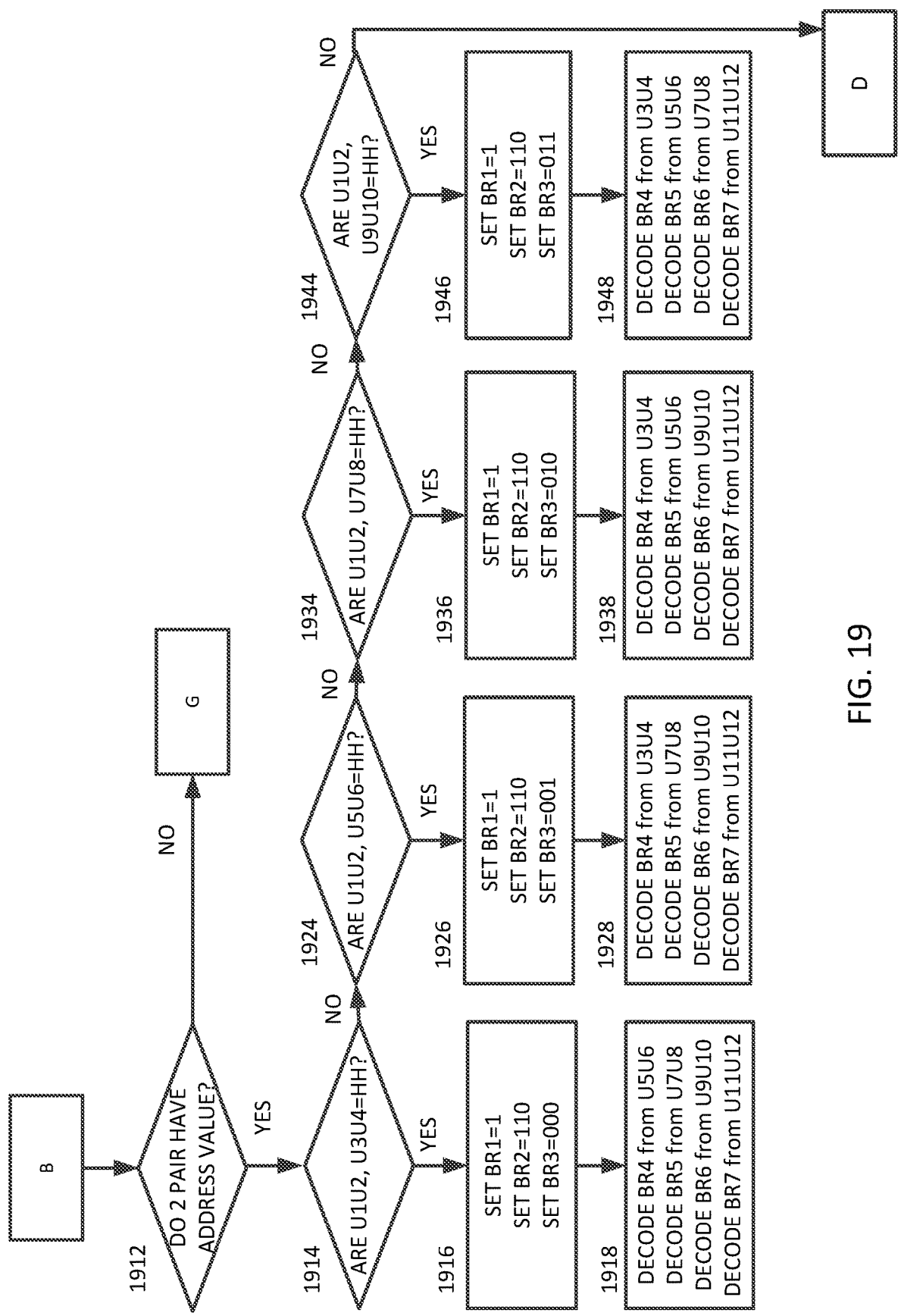
Figure 20:
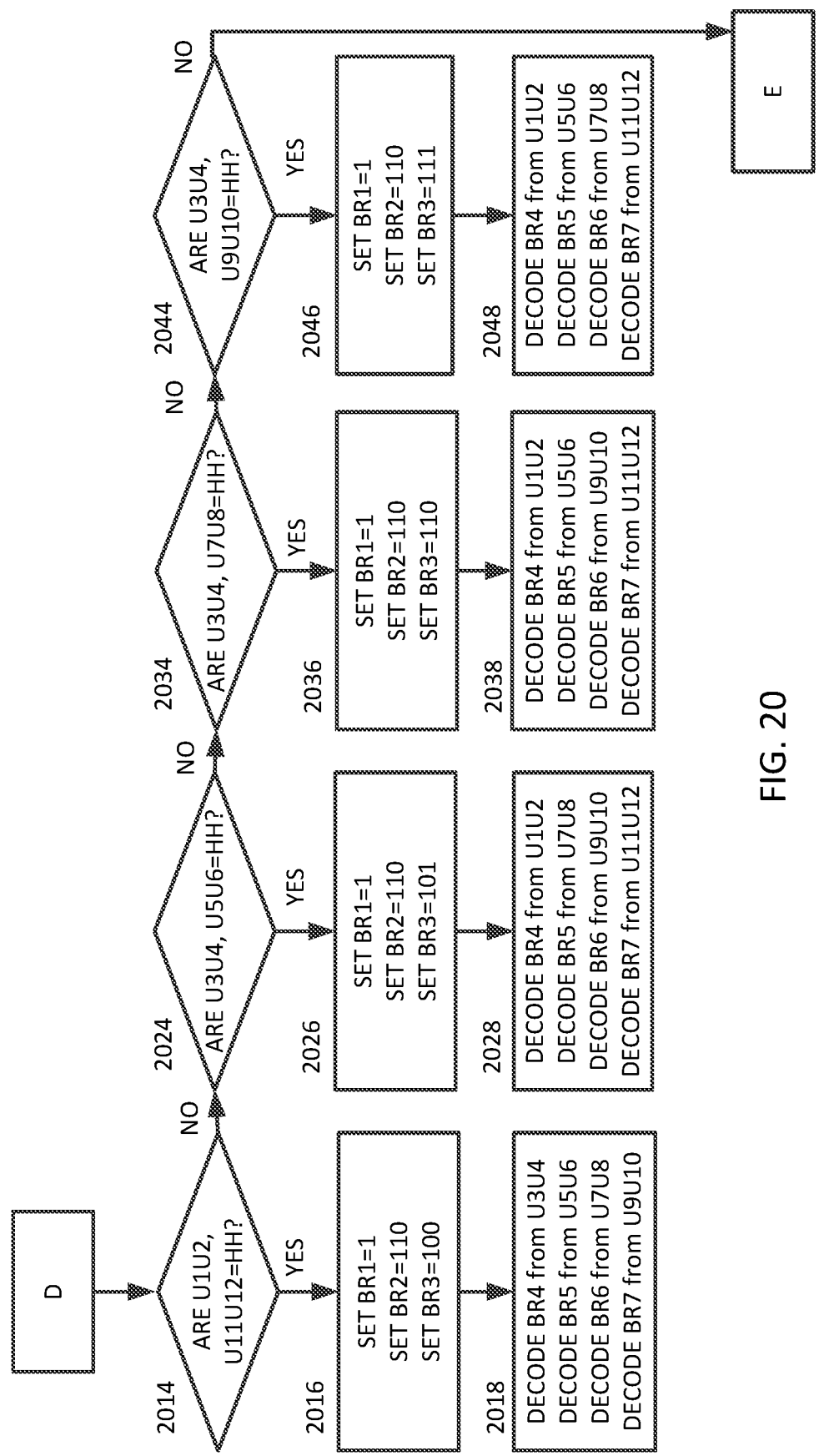
Figure 21:
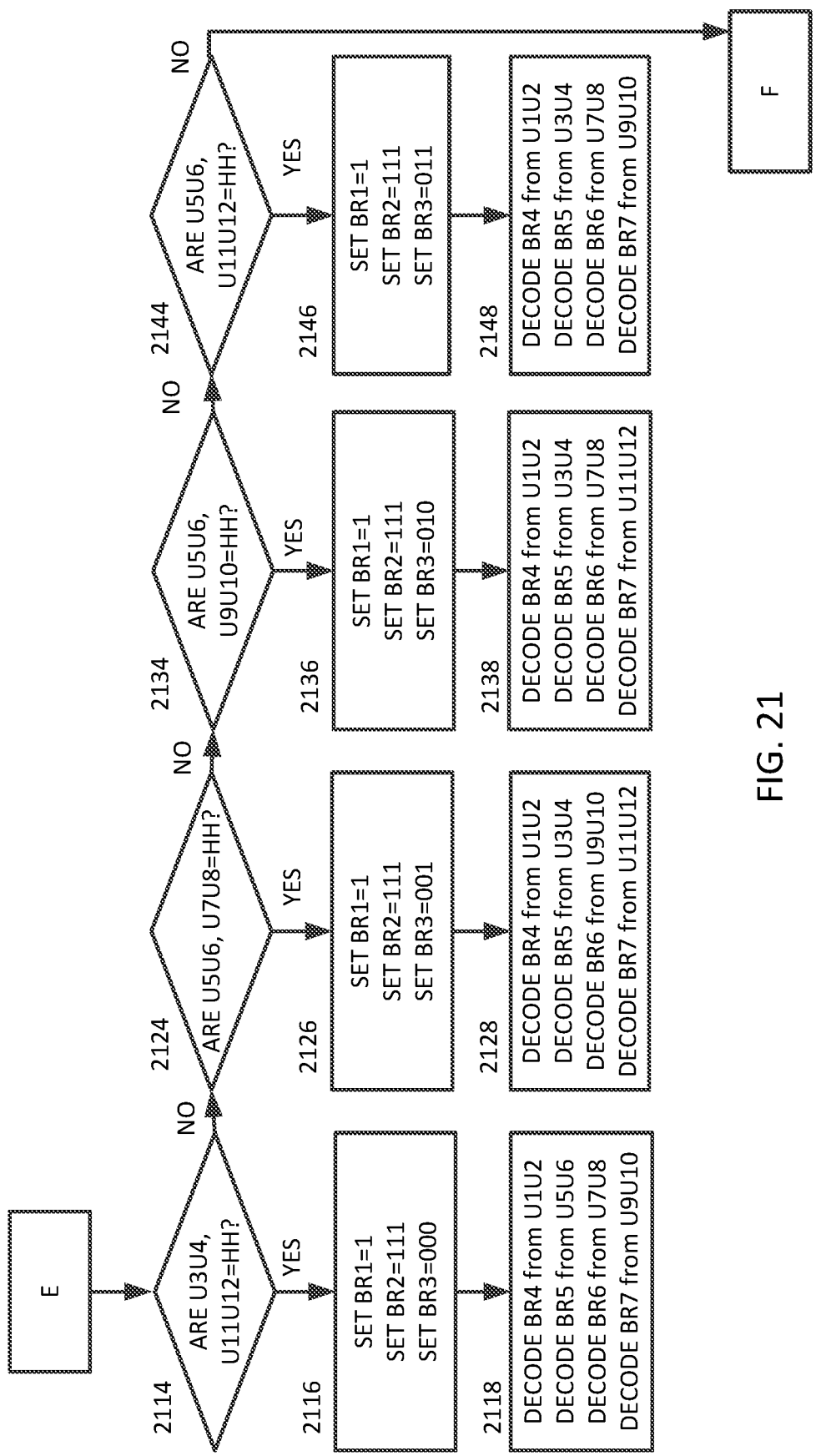
Figure 22:
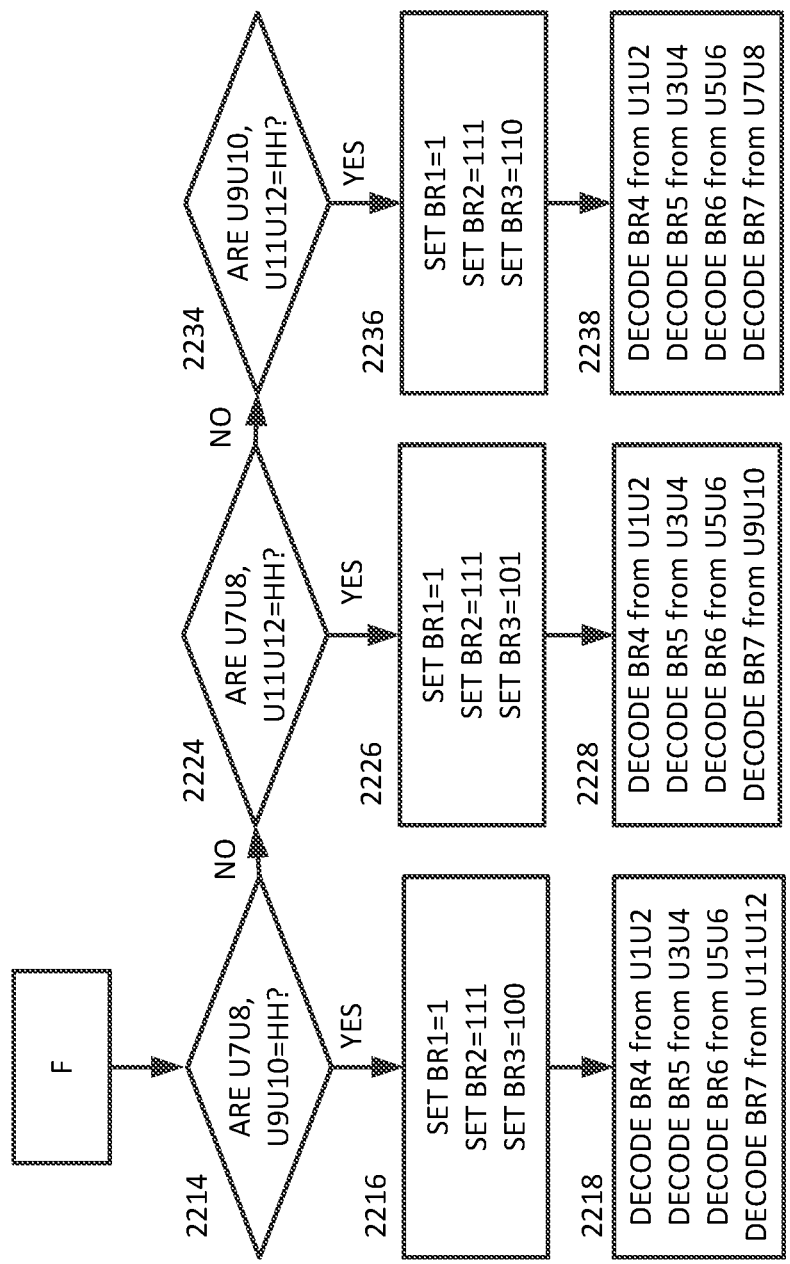

If the second branch has a does not have the first specific value in act 1112, the encoding can continue in FIGS. 13-14. If the third branch bits have a value in a third set of values in acts 1314, 1324, 1324, 1344, 1414, 1424, and 1434, 1444, then two pairs of symbols can be assigned the address value in acts 1316, 1326, 1336, 1346, 1416, 1426, 1436, and 1448, where the location of the address values are dependent on the value of the second branch bits and the third branch bits. The remaining 4 groups of three bits can be encoded into the remaining 4 pairs of symbols in acts 1318, 1328, 1338, 1348, 1418, 1428, 1438, and 1448. Again, there is no need to encode the first branch bit since its value can be determined by a decoder from the presence of an address value. There is also no need to encode the second or third branch bits since their value can be determined by a decoder from the presence of two address values.

If the third branch bits do not have a value in the third set of values, then a subsequent set of three bits can be used as fourth branch bits. Three pairs of symbols can be assigned the address value in acts 1516, 1526, 1536, 1546, 1616, 1626, 1636, and 1646, where the location of the address values are dependent on the value of the second branch bits, the third branch bits, and the fourth branch bits. The remaining 3 groups of three bits can be encoded into the remaining 3 pairs of symbols in acts 1518, 1528, 1538, 1548, 1618, 1628, 1638, and 1648. Again, there is no need to encode the first branch bit since its value can be determined by the presence of an address value. There is also no need to encode the second, third, or fourth branch bits since their value can be determined by a decoder from the presence of three address values.

FIGS. 17-25 illustrate another method of decoding data according to an embodiment of the present invention. In this embodiment, a second number of symbols can be received and decoded into the first number of bits. The received second number of symbols can be examined to see if one or more symbols have been assigned the address value. If they have, then depending on which symbols have the address value, the remaining symbols in the second number of symbols can be decoded, resulting in the decoded first number of bits. If the received second number of symbols do not include the address value, then the symbols can be decoded and the first number of bits recovered.

In a specific embodiment, a series of 12 three-level symbols can be decoded into 19 bits. In this example, the 12 symbols can be arranged in 6 pairs in act 1710. Three of those 6 pairs can have the address value in one of 8 combinations. The 6 symbols pairs are checked to see if they have 3 pairs with address values in one of those 8 combinations in act 1712 in FIGS. 17-18. If they do, a first branch bit, second branch bits, third branch bits, and fourth branch bits can be determined in acts 1716, 1726, 1736, 1746, 1816, 1826, 1836, and 1846. The remaining bits can be decoded from the remaining symbols in acts 1718, 1728, 1738, 1748, 1818, 1828, 1838, and 1848.

If three symbol pair do not have the address value, a check of whether two symbol pairs have the address value is done in act 1912 on FIGS. 19-22. The 6 symbol pairs can have two with address values in one of 15 combinations. If they do, a first branch bit, second branch bits, and third branch bits can be determined in acts 1916, 1926, 1936, 1946, 2016, 2026, 2036, 2046, 2116, 2126, 2136, 2146, 2216, 2226, and 2236. The remaining bits can be decoded from the remaining symbols in subsequent acts as shown.

Figure 23:
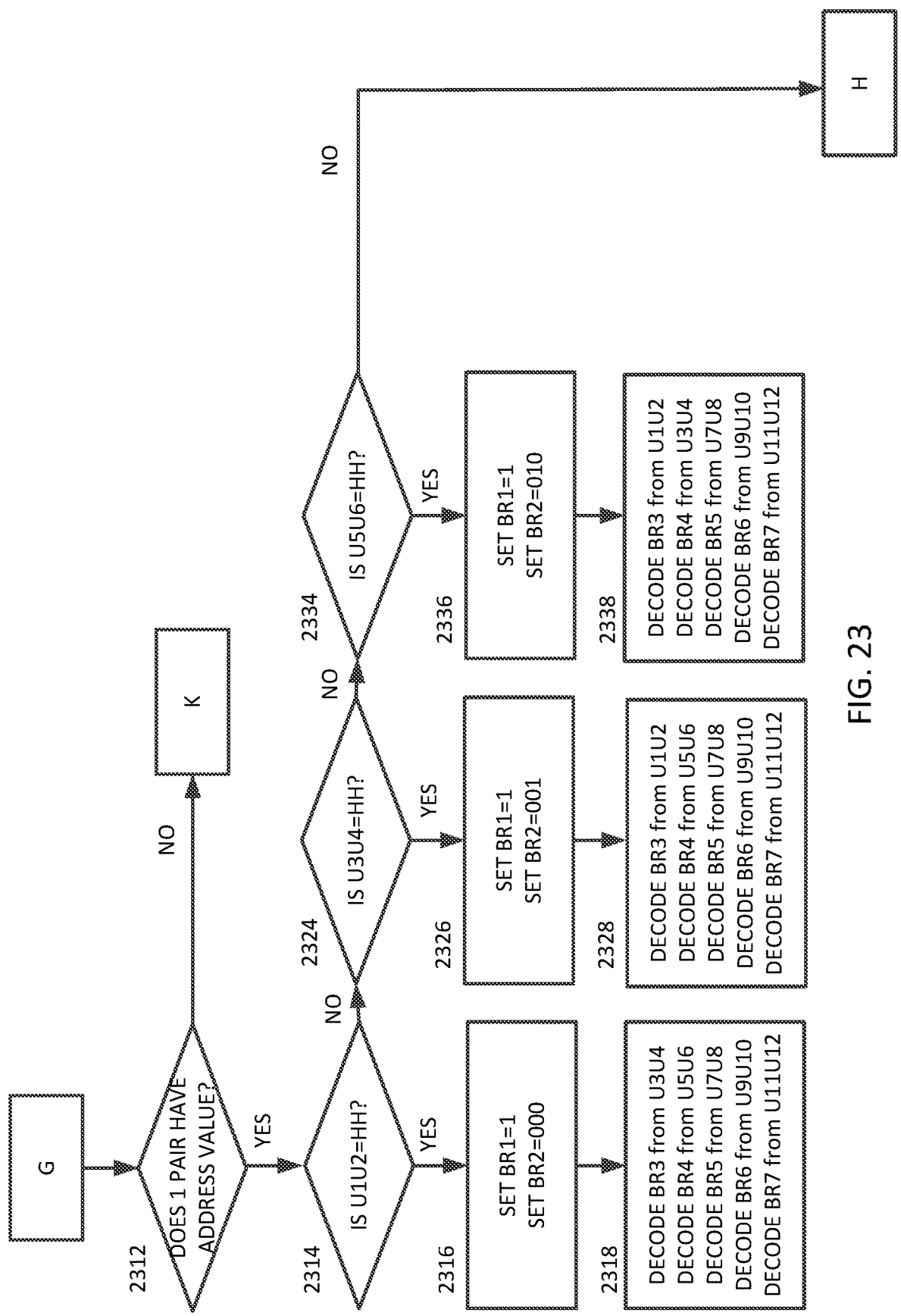
Figure 24:
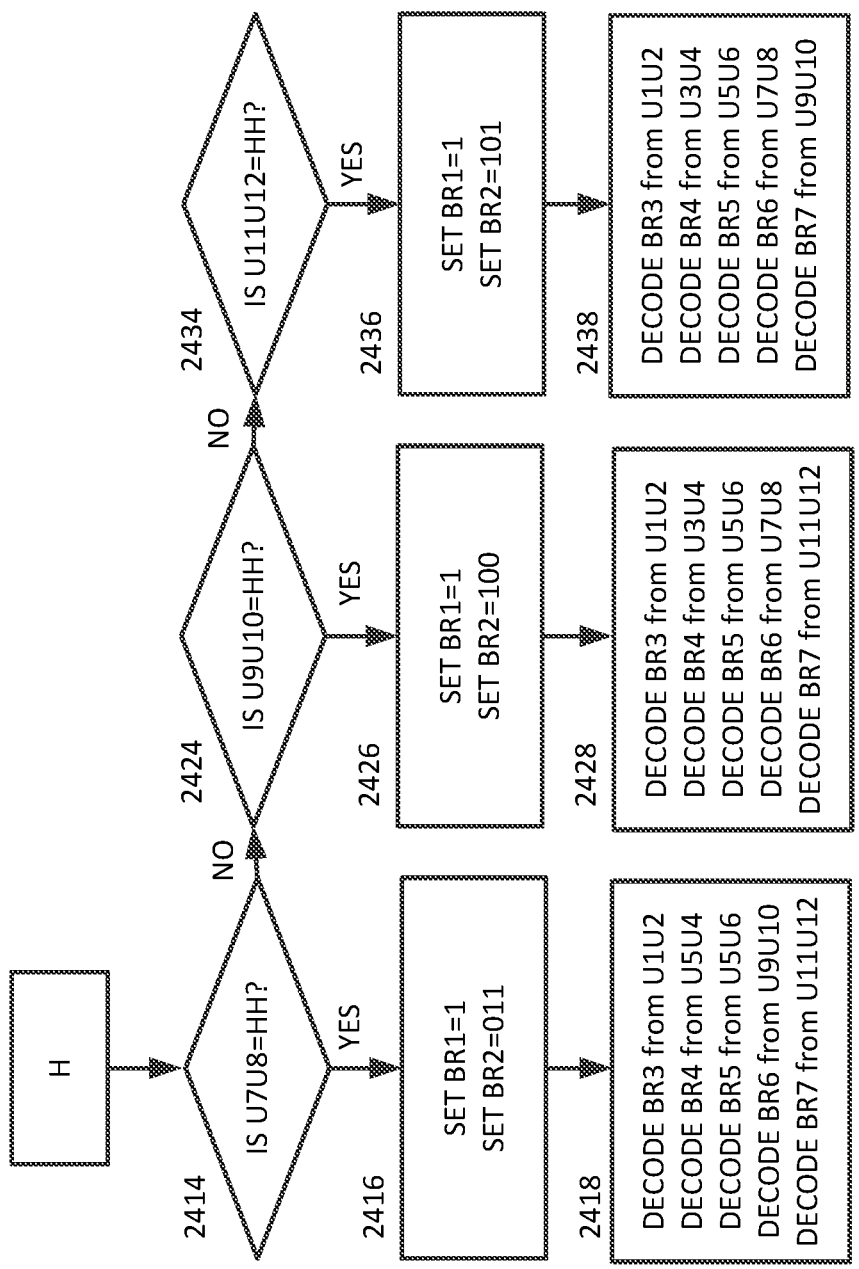
Figure 25:
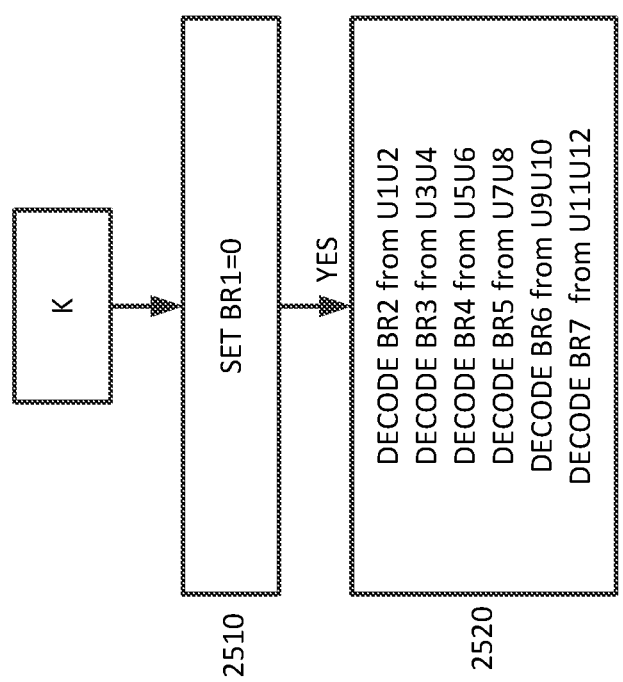

If two symbol pairs do not have the address value, a check of whether one symbol pair has the address value is done in act 2312 and on FIGS. 23-24. If it does, a first branch bit and second branch bits can be set in act 2510. The remaining bits can be decoded from the remaining symbols. If no symbol pair have the address value, the first branch bit can be set in act 2510 and the symbol pairs can be decoded directly in act 2520 in FIG. 25. Again, each of these symbol decoding can be done as shown in FIG. 4, or in a different manner.

In these and other embodiments of the present invention, eleven bits can be encoded into a series of 7 three-level symbols. This coding can be selected for its efficiency since eleven bits defines 2048 possibilities, while 7 three-level symbols provides 2187 combinations into which the 2048 possibilities can be mapped. But this means that not all of the three-level states are used. This can lead to random data not having an average value of the middle state. The resulting baseline wander can reduce a usable signal amplitude and lead to errors. Accordingly, embodiments of the present invention can modify the above encryption schemes to reduce the resulting baseline wander. For example, in FIG.

5 above, the 8 possible states for BR2 can be encoded as one of three positions for the address value and the first symbol U7. U7 can be L for three states, 0 for three states, and H for two states. As a result, the average value for U7 might not be 0. Accordingly, when BR2 has a value of 100, U7 can be alternately set to H. The result can then be that U7 can be L for three states, 0 for two states, and H for three states. As a result, the average value for U7 can be 0. Other methods of reducing baseline wander are shown in the following figures.

Figure 26:
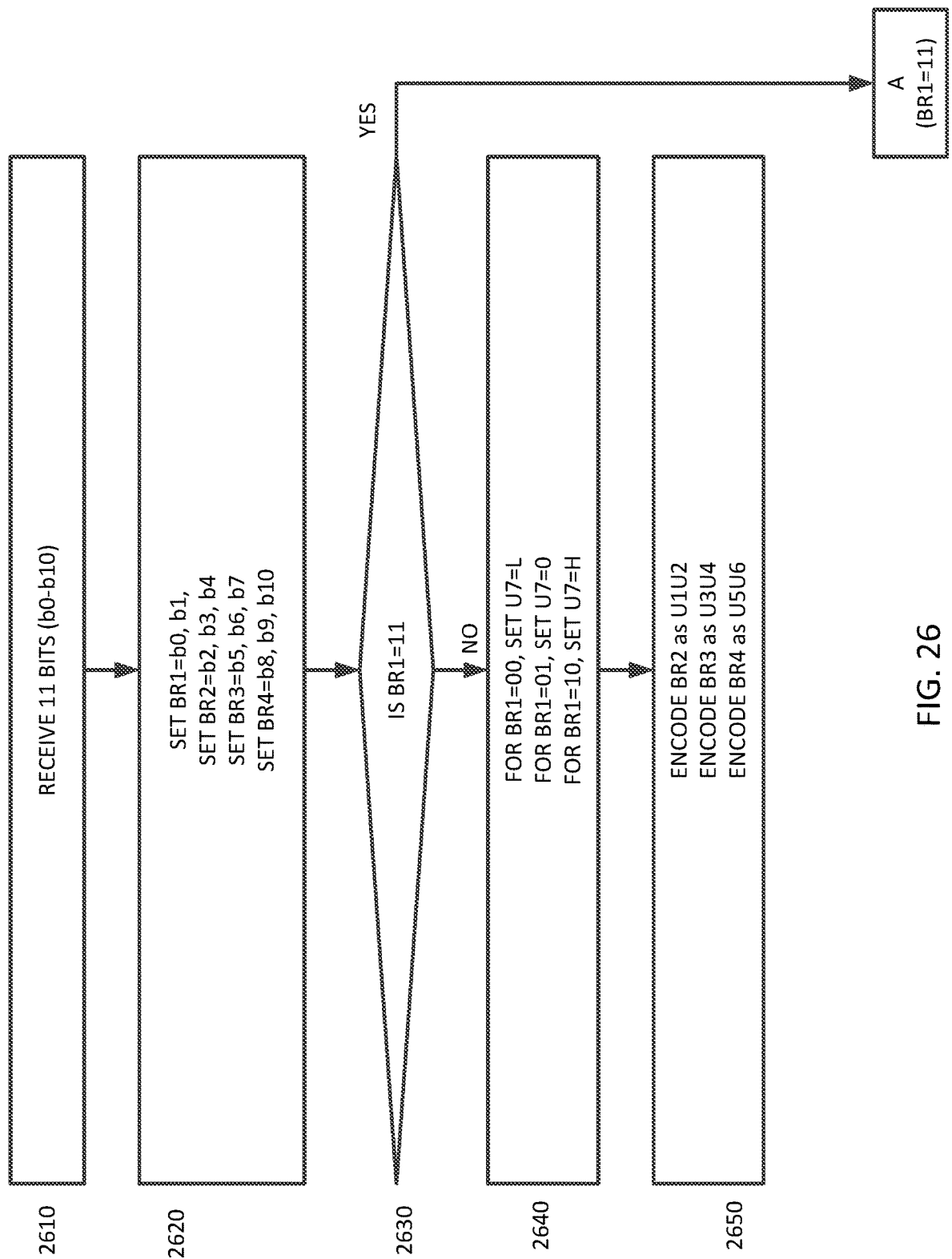
FIGS. 26-27 illustrate another method of encoding data according to an embodiment of the present invention.
Figure 27:
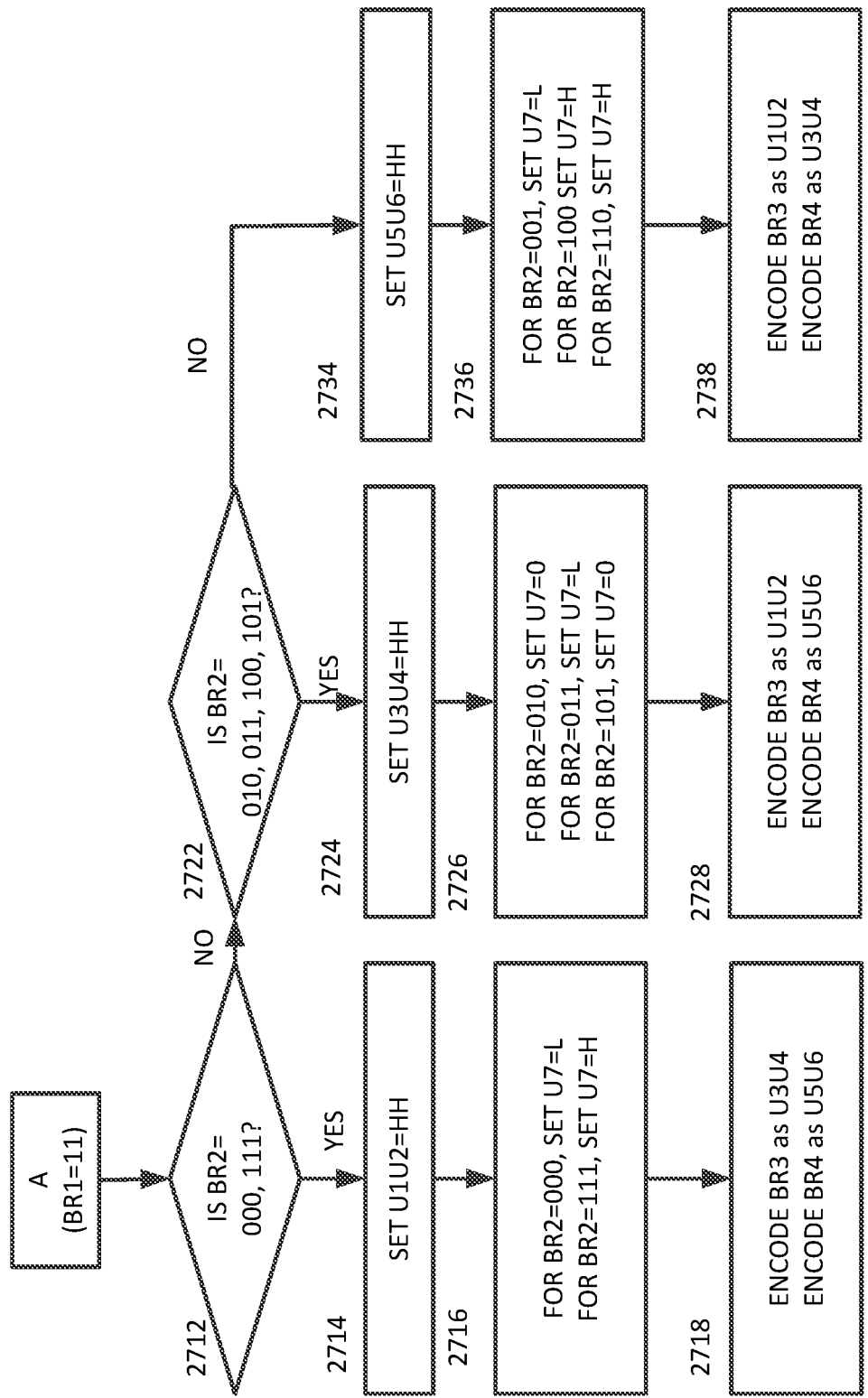

FIGS. 26 and 27 illustrate a method of encoding data according to an embodiment of the present invention. This illustrative embodiment can provide a method of encoding data where a first number of bits are received and encoded into a second number of symbols for transmission. One or more first branch bits can be read, and it can be determined if the first branch bits have a value in a set of one or more possible values for the branch bits. If they do, the remaining bits can be encoded in a series of symbols using a translation table (or other method.) The first branch bits can also be encoded into a symbol. If the first branch bits do not have a value in the set of one or more possible values, then one or more second branch bits can be read. Given the value of the second branch bits, one or more symbols in the second number of symbols can be assigned an address value, where the address value is a value that binary data can't be encoded into using the translation table. The remaining bits can then be encoded into the remaining symbols in the second number of symbols using the translation table.

In FIG. 26, eleven bits can be received in act 2610. In act 2620, the bits can be arranged in branch bits, where a first branch BR1 is equal to the first two bits, b0 and b1, and where each subsequent branch is equal to the following three bits for four groups of branch bits. If the first branch bits have one of three possible values in act 2630, for example 00, 01, or 10, those two bits can be encoded as a first symbol in act 2640. The three subsequent groups of three bits each can then be encoded into two symbols in act 2650. The resulting 7 symbols can then be transmitted.

If the first branch bits from FIG. 26 do not have one of three possible values, for example they have a value of 11, the first branch bits can't be encoded in the first symbol. Instead, the first group of three bits b2, b3, and b4, which are referred to as the second branch bits BR2, are read and the encoding procedure continues at block A in FIG. 27. Depending on the value of the second branch bits BR2, the second branch bits BR2 are encoded as the first symbol U7 in acts 2716, 2726, and 2736, and one of the three subsequent groups of two symbols can be assigned the address value (HH) in acts 2714, 2724, and 2734. The first branch bits do not need to be encoded since their value (11) can be determined by a decoder from the presence of an address value. The remaining bits can be encoded into the remaining symbols as shown in acts 2718, 2728, and 2738.

Figure 28:
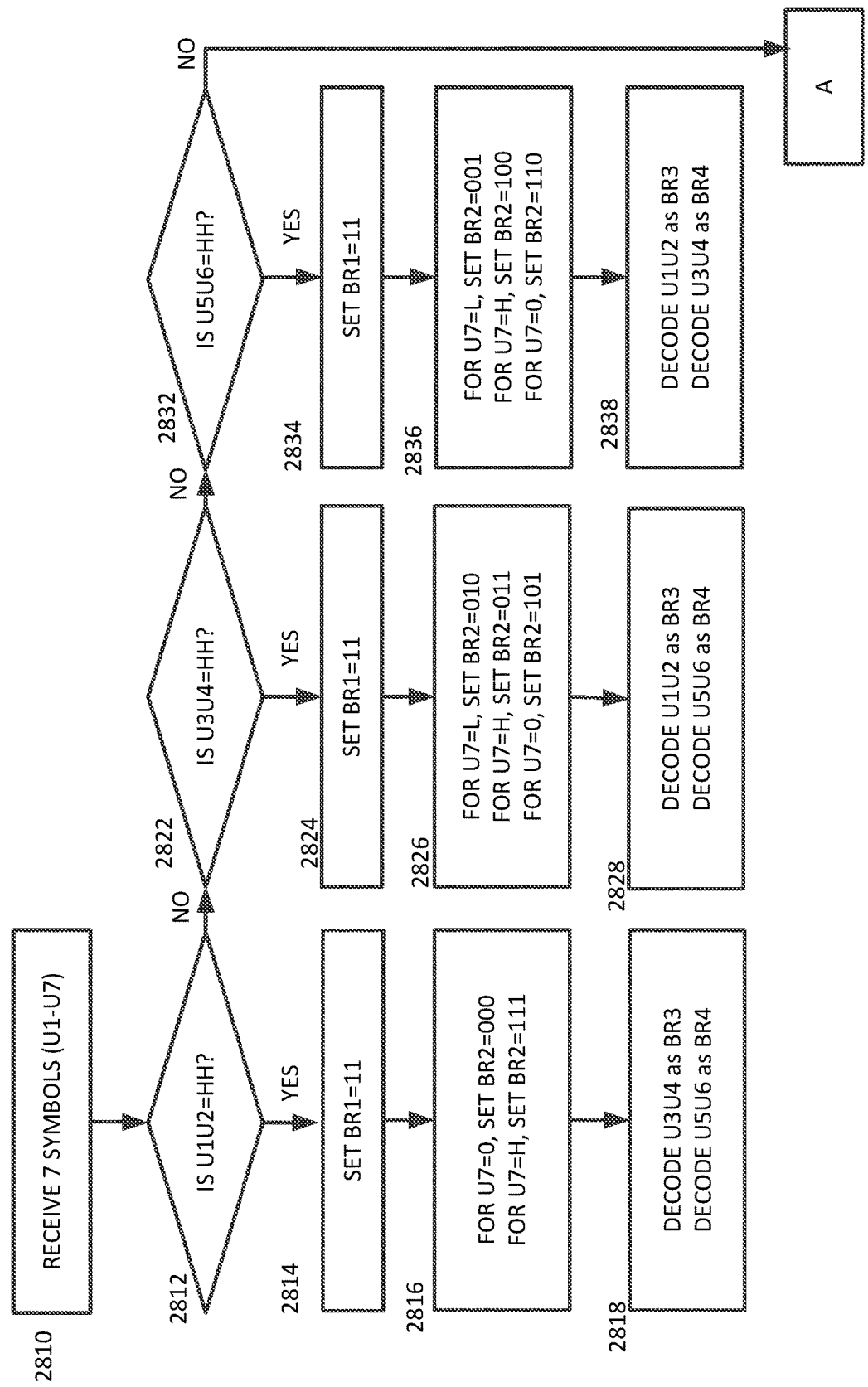
FIGS. 28-29 illustrate a method of decoding data according to an embodiment of the present invention.
Figure 29:
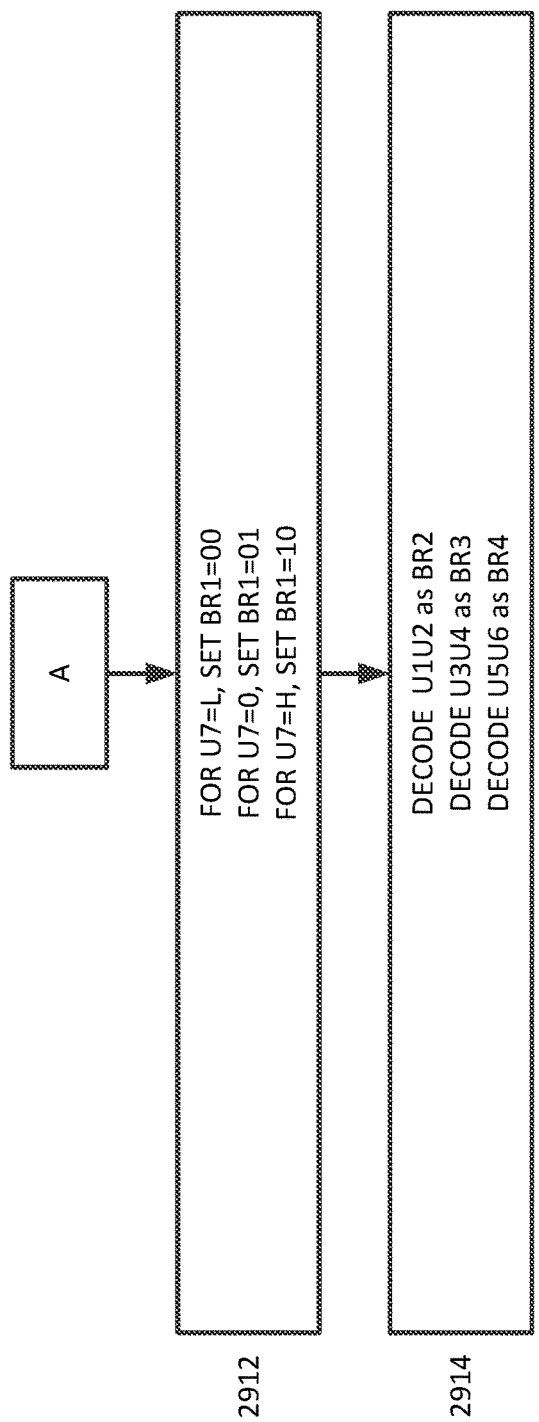

FIGS. 28-29 illustrate a method of decoding data according to an embodiment of the present invention. In this example, the second number of symbols are received and decoded into the first number of bits. The received second number of symbols can be examined to see if one or more symbols have been assigned the address value. If they have, then depending on which symbols have the address value, along with the value of the first symbol, the remaining symbols in the second number of symbols can be decoded, resulting in the decoded first number of bits. If the received second number of symbols do not include the address value, then the symbols can be decoded and the first number of bits recovered.

In this specific embodiment of the present invention, 7 three-level symbols can be decoded into eleven bits. A group of seven symbols U1-U7 can be received in act 2810. In this example, U7 can be referred to as a first symbol and U1U2, U3U4, and U5U6 can be referred to as symbol pairs. The symbol pairs can be checked for the presence of an address value in acts 2812, 2822, and 2832. If an address value is found, a value for the two first branch bits BR1 can be determined to have a value of 11 in acts 2814, 2824, and 2834, consistent with the encoding scheme above. The first symbol can be read and from that the second branch bits BR2 can be determined in acts 2816, 2826, and 2836. The remaining bits can be determined given the position of the address bits in acts 2818, 2828, and 2838. More specifically, since the first branch bits and the second branch bits are known, 6 other bits in the last two groups of three bits, remain to be determined. The address value can be located in a pair of the remaining 6 symbols, leaving two groups of two symbols to be decoded. Each group of two symbols can then be decoded into three bits, thereby completing the decoded set of eleven bits.

If an address value is not present in the 7 three-level symbols, the decoding can proceed to block A in FIG. 29. The first symbol can be decoded into the two first branch bits in act 2912. The remaining three groups of two bits each can be decoded into three groups of three bits in act 2914, thereby completing the eleven decoded bits.

These and other embodiments of the present invention can provide further techniques for reducing baseline wander. For example, the translation table of FIG. 4 can be further modified to include an offset. An example is shown in the following figure.

Figure 31:
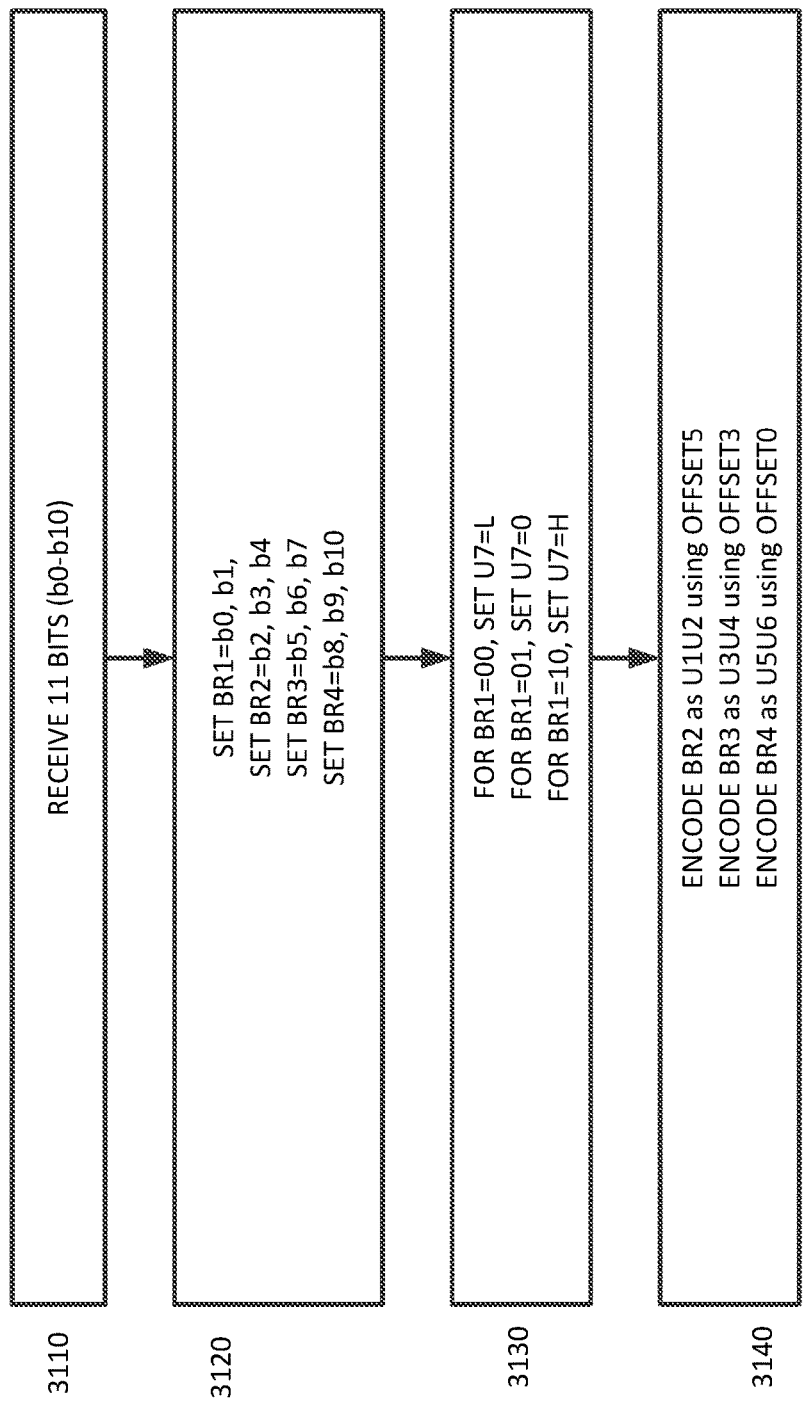

FIG. 30 illustrates offset that can be used in embodiments of the present invention. For each three-bit group 3000 can be translated to an offset value 3010. In this example, eight different offset values are shown. In FIG. 31, the offset values can be used to encode data bits in act 3140.

In these and other embodiments of the present invention can vary the above examples to further reduce baseline wander. An example is shown in the following figures.

Figure 32:
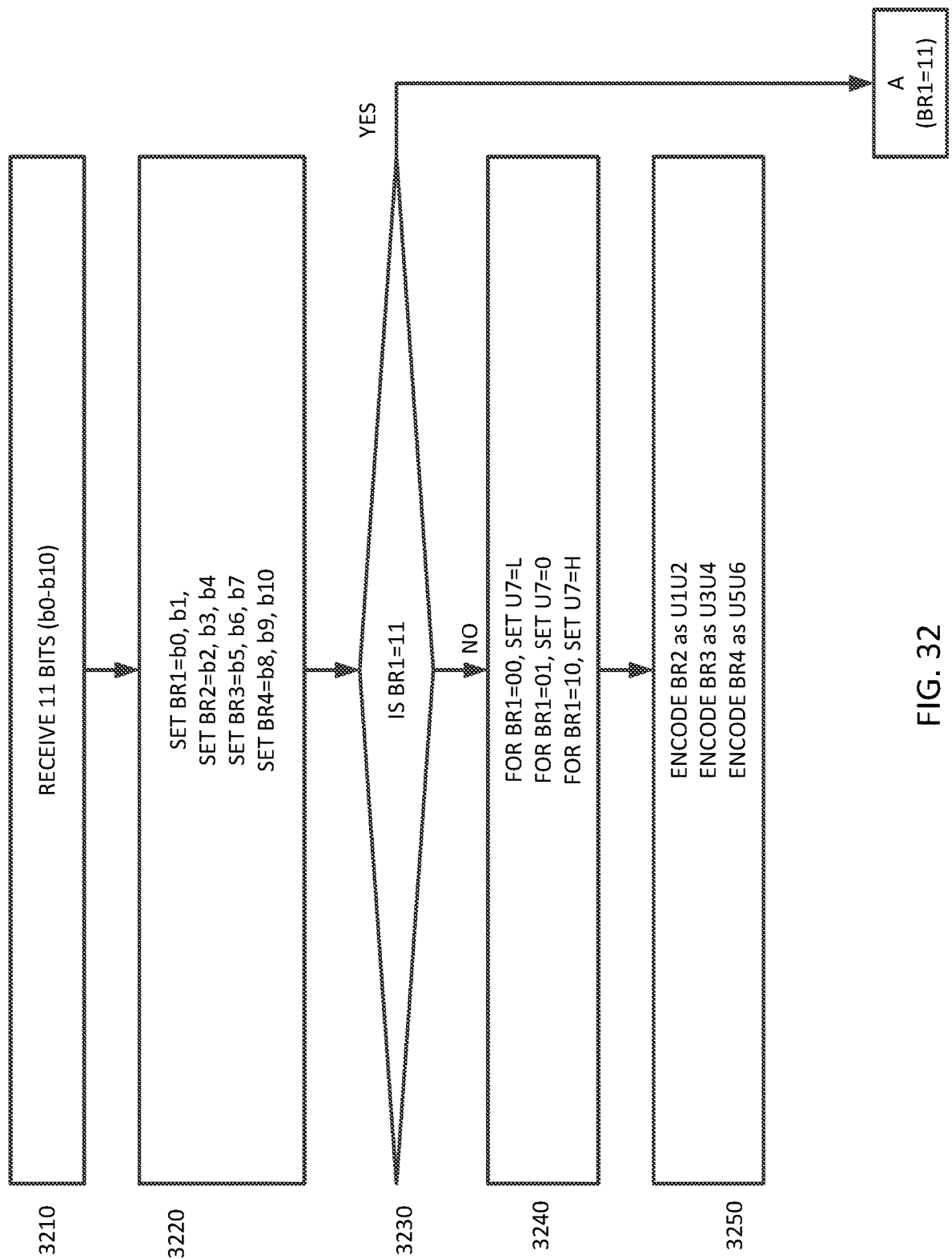
Figure 34:
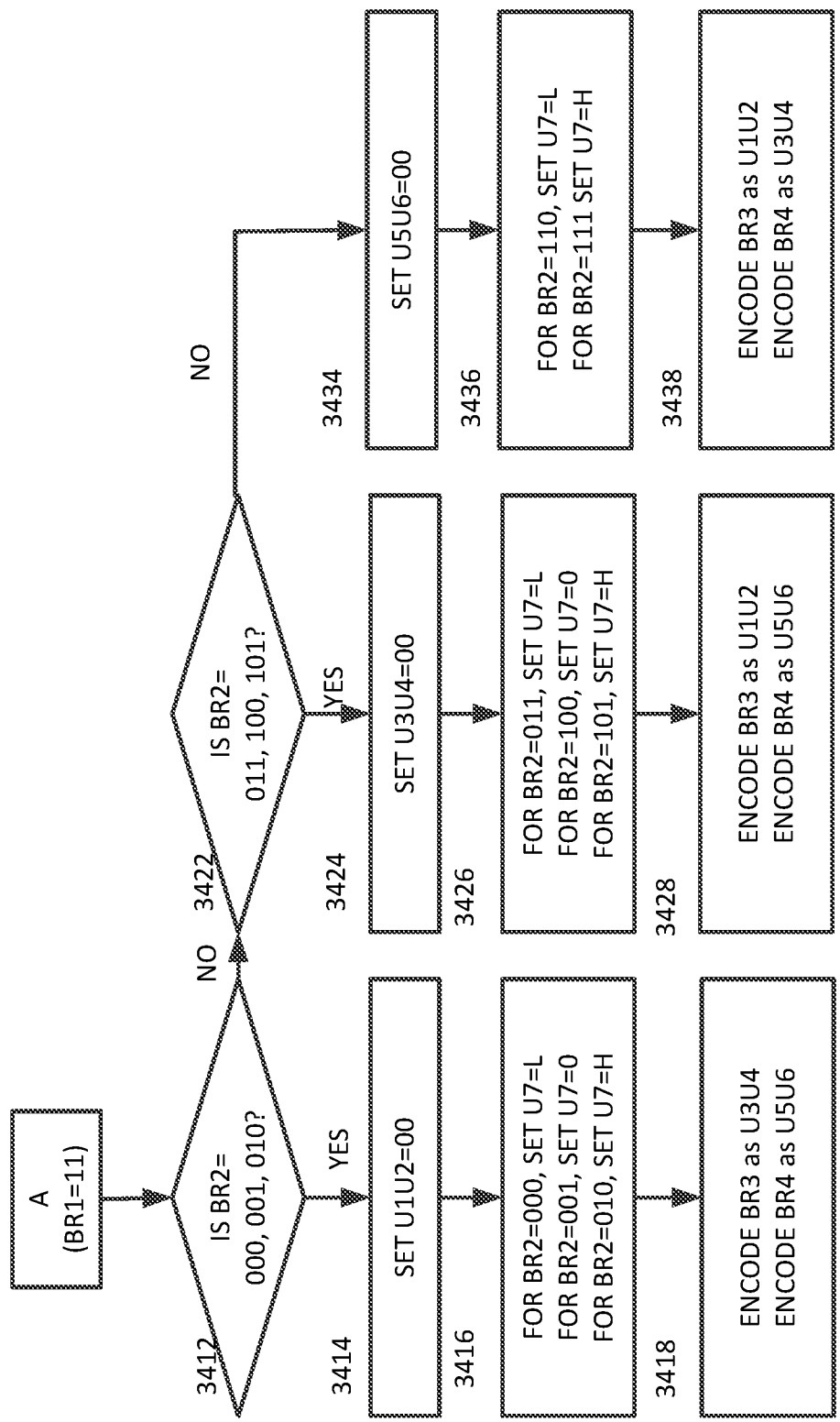

FIGS. 32-34 illustrate another method of encoding data according to an embodiment of the present invention. This illustrative embodiment can provide a method of encoding data where a first number of bits are received and encoded into a second number of symbols for transmission. One or more first branch bits can be read, and it can be determined if the first branch bits have a value in a set of one or more possible values for the branch bits. If they do, the remaining bits can be encoded in a series of symbols using a translation table (or other method.) The first branch bits can also be encoded into a symbol. If the first branch bits do not have a value in the set of one or more possible values, then one or more second branch bits can be read. Given the value of the second branch bits, one or more symbols in the second number of symbols can be assigned an address value, where the address value is a value that binary data can't be encoded into using the translation table. The remaining bits can then be encoded into the remaining symbols in the second number of symbols using the translation table.

In FIG. 32, eleven bits can be received in act 3210. In act 3220, the bits can be arranged in branch bits, where a first branch BR1 is equal to the first two bits, b0 and b1, and where each subsequent branch is equal to the following three bits for four groups of branch bits. If the first branch bits have one of three possible values in act 3230, for example 00, 01, or 10, those two bits can be encoded as a first symbol in act 3240. The three subsequent groups of three bits each can then be encoded into two symbols in act 3250. The resulting 7 symbols can then be transmitted.

As before, groups of three bits can be encoded into two three-level symbols. Three bits can have one of 8 values (8 different combinations), while two three-level symbols can have 9 possible values. This leaves a ninth state for the two symbols that is unused in the encoding of the three bits. This unused ninth state can then be used as an address value, where the presence and position of the address value can be used in decoding a series of symbols. In the translation table of FIG. 33, bits b2, b3, and b4 (for example) can be encoded into PAM3 or other three-level symbols U1 and U2, where U1 and U2 can have a low value, a zero value, or a high value. The translation table of FIG. 33 can also be used to decode symbols U1 and U2 back into bits b2, b3, and b4. This table can be used for encoding various groups of three bits into two symbols, and back again, in the various examples shown below and by other embodiments of the present invention. In these and other embodiments of the present invention, other tables can be used. For example, a table having bits arranged in a gray-code order can be used.

The unused ninth state, in this example a value of 00 for U1 and U2, can be used as the address value in the various examples shown below and by other embodiments of the present invention, though in other embodiments of the present invention, other codes, such as LL or HH, can be used as the address value. This address value can be used to efficiently convey values of branch bits thereby simplifying encoding. These address values can also be used in a corresponding decoder to efficiently decode various branch bits, as shown below.

If the first branch bits from FIG. 32 do not have one of three possible values, for example they have a value of 11, the first branch bits can't be encoded in the first symbol. Instead, the first group of three bits b2, b3, and b4, which are referred to as the second branch bits BR2, are read and the encoding procedure continues at block A in FIG. 34. Depending on the value of the second branch bits BR2, the second branch bits BR2 are encoded as the first symbol U7 in acts 3416, 3426, and 3436, and one of the three subsequent groups of two symbols can be assigned the address value (HH) in acts 3414, 3424, and 3434. The first branch bits do not need to be encoded since their value (11) can be determined by a decoder from the presence of an address value. The remaining bits can be encoded into the remaining symbols as shown in acts 3418, 3428, and 3438.

Figure 35:
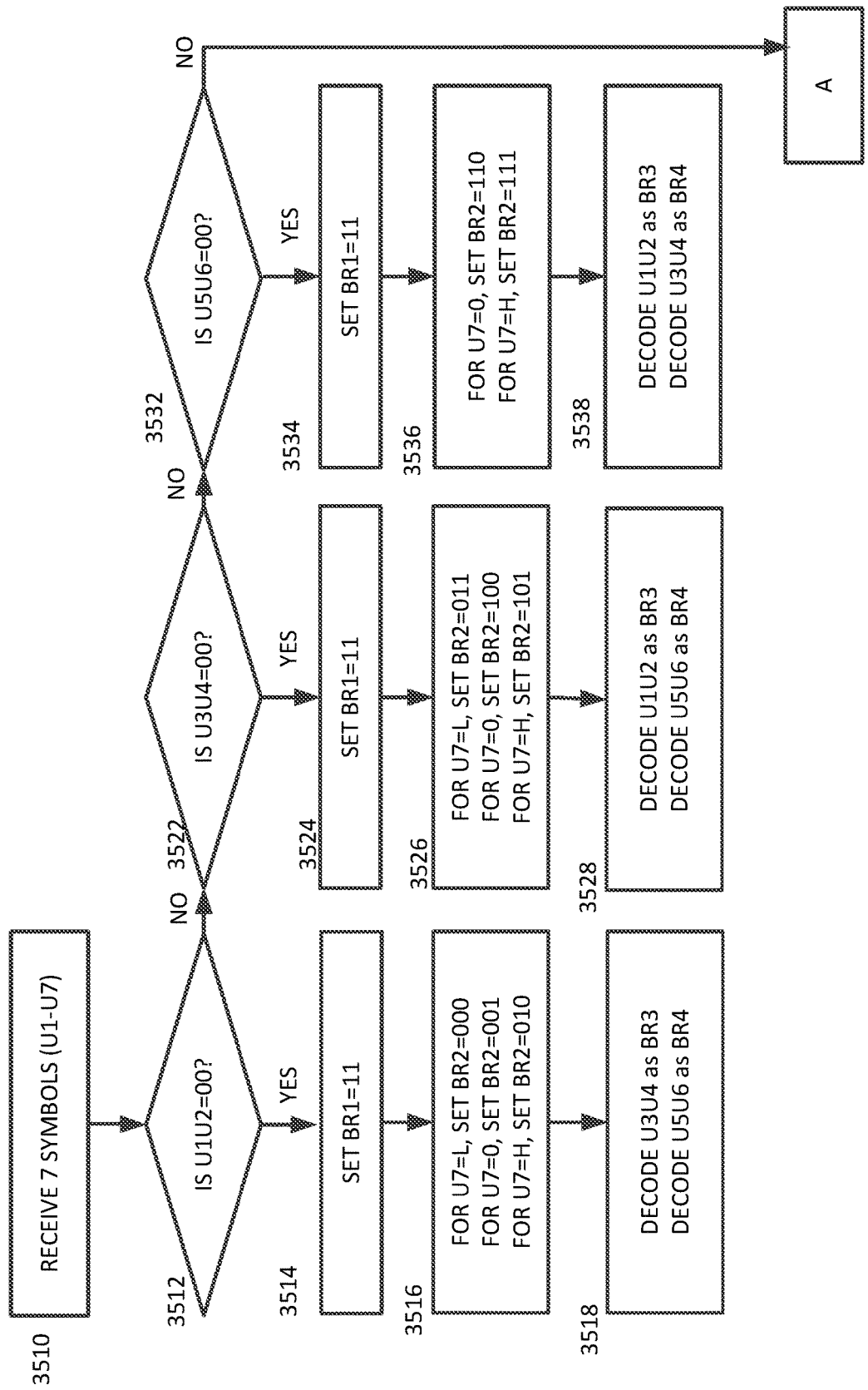
FIGS. 35-36 illustrate a method of decoding data according to an embodiment of the present invention.
Figure 36:
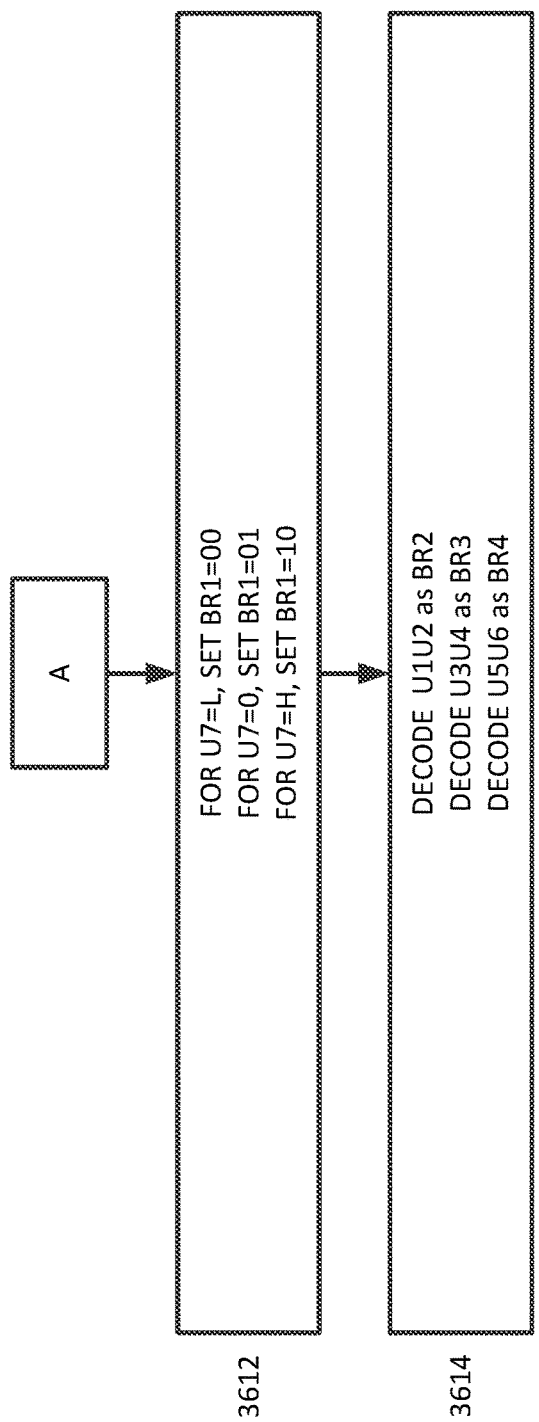

FIGS. 35-36 illustrate a method of decoding data according to an embodiment of the present invention. In this example, the second number of symbols are received and decoded into the first number of bits. The received second number of symbols can be examined to see if one or more symbols have been assigned the address value. If they have, then depending on which symbols have the address value, along with the value of the first symbol, the remaining symbols in the second number of symbols can be decoded, resulting in the decoded first number of bits. If the received second number of symbols do not include the address value, then the symbols can be decoded and the first number of bits recovered.

In this specific embodiment of the present invention, 7 three-level symbols can be decoded into eleven bits. A group of seven symbols U1-U7 can be received in act 3510. In this example, U7 can be referred to as a first symbol and U1U2, U3U4, and U5U6 can be referred to as symbol pairs. The symbol pairs can be checked for the presence of an address value in acts 3512, 3522, and 3532. If an address value is found, a value for the two first branch bits BR1 can be determined to have a value of 11 in acts 3514, 3524, and 3534, consistent with the encoding scheme above. The first symbol can be read and from that the second branch bits BR2 can be determined in acts 3516, 3526, and 3536. The remaining bits can be determined given the position of the address bits in acts 3518, 3528, and 3538. More specifically, since the first branch bits and the second branch bits are known, 6 other bits in the last two groups of three bits, remain to be determined. The address value can be located in a pair of the remaining 6 symbols, leaving two groups of two symbols to be decoded. Each group of two symbols can then be decoded into three bits, thereby completing the decoded set of eleven bits.

If an address value is not present in the 7 three-level symbols, the decoding can proceed to block A in FIG. 36. The first symbol can be decoded into the two first branch bits in act 3612. The remaining three groups of two bits each can be decoded into three groups of three bits in act 3614, thereby completing the eleven decoded bits.

These and other embodiments of the present invention can utilize a translation table or similar technique, such as the translation table as shown in FIG. 33. In this example, three bits can be translated to one of eight two-symbol combinations. The remaining unused ninth state can be used as an address value, in this case 00. As shown in this example, when the bridge bits have a value of 11, one of the three pairs of symbols are assigned the address value 00, and since only one symbol pair can be assigned the address value 00 and none of the various three-bit combinations can be assigned the value of 00, there must be a transition edge within every 7 three-level symbols. Ensuring a transition edge every 7 symbols when the bridge bits are 11 can be used to ensure regular edges to provide a run-length limited encoding scheme. For example, eleven-bit words having bridge bits with a value of 11 can be inserted in a data stream to ensure the occurrence of transition edges. Other techniques, such as the use of an offset as described above can also be used or included in such an encoding scheme.

These and other embodiments of the present invention can provide encoders and decoders that can be readily implemented using a minimal amount of logic gates. This can reduce component size, save power, speed design, and improve yields. While examples are shown utilizing specific numbers of bits, symbols, and type of symbols, these and other embodiments of the present invention can utilize different numbers of bits, symbols, and different types of symbol, such as four or five level symbols. Other types of encoding (and decoding), such as phase or frequency encoding, can also be used.

Embodiments of the present invention can provide data encoders and decoders that can be used in various types of devices, such as lighting, portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. Encoded signals can be transmitted using interface circuits and connector receptacles that can provide pathways for signals and power compliant with various standards such as one of the Universal Serial Bus standards including USB Type-C, High-Definition Multimedia Interface, Digital Visual Interface, Ethernet, DisplayPort, Thunderbolt, Lightning, Joint Test Action Group test-access-port, Directed Automated Random Testing, universal asynchronous receiver/transmitters, clock signals, power signals, and other types of standard, non-standard, and proprietary interfaces and combinations thereof that have been developed, are being developed, or will be developed in the future.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A method of encoding binary data, the method comprising:
    receiving a first number of bits including first branch bits, second branch bits, and remaining bits;
    determining if the first branch bits have a first value in a set of possible values, and if they do not, then
    encoding the first branch bits into a second number of symbols;
    encoding the second branch bits and the remaining bits into a third number of symbols; and if the first branch bits have the first value in the set of possible values, then
    assigning an address value to a fourth number of symbols; not encoding the first branch bits; and
    encoding the second branch bits and the remaining bits into a fifth number of symbols.

2. The method of claim 1 wherein the second number of symbols, the third number of symbols, the fourth number of symbols, and the fifth number of symbols are three-level symbols, and wherein a sum of the second number and the third number is equal to a sum of the fourth number and the fifth number.

3. The method of claim 1 wherein when the first branch bits do not have the first value, the second branch bits are encoded into a sixth number of symbols, and when the first branch bits have the first value, the second branch bits are encoded as a seventh number of symbols, the seventh number less than the sixth number.

4. The method of claim 3 wherein the second number of symbols is 1 symbol, the third number of symbols is 6 symbols, the fourth number of symbols is 2 symbols, and the fifth number of symbols is 5 symbols.

5. The method of claim 4 wherein an identity of the fourth number of symbols assigned to have the address value is based on a value of the second branch bits.

6. The method of claim 5 wherein the second branch bits are encoded as a first symbol and the address value is assigned to one of three pairs of symbols.

7. The method of claim 6 wherein groups of three bits are encoded into pairs of symbols, such that 8 of 9 possible combinations for a pair of symbols are used, and 1 of 9 possible combinations is the address value, where the 1 of 9 possible combinations is not included in the 8 of 9 possible combinations.

8. A method of decoding symbol data, the method comprising:
    receiving a first number of symbols, the first number of symbols comprising a first symbol and a plurality of symbol pairs;
    determining if any of the plurality of symbol pairs has an address value, and if it does then
    setting first branch bits to a first value;
    setting second branch bits based on a value of the first symbol and an identity of the symbol pair having the address value; and
    decoding the plurality of symbol pairs other than the symbol pair having the address value to a second number of bits; and if none of the symbol pairs has the address value, then
    decoding the first symbol to the first branch bits; and
    decoding the plurality of symbol pairs to a third number of bits.

9. The method of claim 8 wherein the first symbol and each symbol in the plurality of symbol pairs are three-level symbols.

10. The method of claim 9 wherein the second number of bits comprises 6 bits, the third number of bits comprises 9 bits, the first branch bits comprises 2 bits, and the second branch bits comprises three bits.

11. The method of claim 10 wherein the plurality of symbol pairs comprises 6 symbols.

12. The method of claim 11 wherein the plurality of symbol pairs other than a symbol pair having the address value are decoded based on a position of the address value.

13. The method of claim 12 wherein before decoding, groups of three bits are encoded into pairs of symbols, such that 8 of 9 possible combinations for a pair of symbols are used, and 1 of 9 possible combinations is the address value, where the 1 of 9 possible combinations is not included in the 8 of 9 possible combinations.

14. A method of encoding binary data, the method comprising:
    receiving a first number of bits including a first branch bit, second branch bits, and remaining bits;
    determining if the first branch bit has a first value, and if it does, then
    encoding the second branch bits and the remaining bits into a second number of symbols; and if the first branch bit does not have the first value, then
    assigning an address value to a third number of symbols; not encoding the second branch bits; and
    encoding the remaining bits into a fourth number of symbols, the fourth number equal to the second number less the third number.

15. The method of claim 14 wherein an identity of the third number of symbols assigned the address value is based on a value of the second branch bits.

16. The method of claim 15 wherein the address value is assigned to a pair of symbols.

17. A method of decoding symbol data, the method comprising:
    receiving a plurality of symbols pairs;
    determining if only one symbol pair in the plurality of symbol pairs has an address value, and if it does then
    setting a first branch bit to a first value;
    setting second branch bits based on an identity of the symbol pair having the address value; and
    decoding the plurality of symbol pairs other than the symbol pair having the address value to a first number of bits; and if none of the symbol pairs has the address value, then
    decoding the plurality of symbol pairs to a second number of bits.

18. The method of claim 17 further comprising:
    if none of the symbol pairs has the address value, then setting the first branch bit to a second value, the second value different from the first value.

19. The method of claim 18 wherein the plurality of symbol pairs other than the symbol pair having the address value are decoded based on a position of the address value.

20. The method of claim 1 wherein encoding the second branch bits and the remaining bits into a second number of symbols comprises using an offset value.

\* \* \* \* \*